United States Patent
Eldridge et al.

(10) Patent No.: US 7,347,702 B2
(45) Date of Patent: **\*Mar. 25, 2008**

(54) CONTACT CARRIERS (TILES) FOR POPULATING LARGER SUBSTRATES WITH SPRING CONTACTS

(75) Inventors: Benjamin N. Eldridge, Danville, CA (US); Thomas H. Dozier, II, Livermore, CA (US); Igor Y. Khandros, Orinda, CA (US); Gaetan L. Mathieu, Varennes (CA); William D. Smith, Sun Lakes, AZ (US)

(73) Assignee: FormFactor, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/561,297

(22) Filed: Nov. 17, 2006

(65) Prior Publication Data

US 2007/0075715 A1    Apr. 5, 2007

Related U.S. Application Data

(63) Continuation of application No. 10/692,114, filed on Oct. 23, 2003, now Pat. No. 7,140,883, which is a continuation of application No. 08/994,799, filed on Dec. 19, 1997, now Pat. No. 6,741,085, which is a continuation of application No. 08/789,147, filed on Jan. 24, 1997, now Pat. No. 5,806,181, which is a continuation-in-part of application No. 08/452,255, filed on May 26, 1995, now Pat. No. 6,336,269, which is a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211, said application No. 08/789,147 is a continuation-in-part of application No. 08/602,179, filed on Feb. 15, 1996, now abandoned, which is a continuation-in-part of application No. 08/584,981, filed on Jan. 11, 1996, now Pat. No. 5,820,014, which is a continuation-in-part of application No. 08/573,945, filed on Dec. 18, 1995, now Pat. No. 5,601,740, which is a continuation-in-part of application No. 08/558,332, filed on Nov. 15, 1995, now Pat. No. 5,829,128, which is a continuation-in-part of application No. 08/554,902, filed on Nov. 9, 1995, now Pat. No. 5,974,662, which is a continuation-in-part of application No. 08/533,584, filed on Oct. 18, 1995, now Pat. No. 5,772,451, which is a continuation-in-part of application No. 08/526,246, filed on Sep. 21, 1995, now abandoned.

(60) Provisional application No. 60/005,189, filed on May 17, 1996, provisional application No. 60/013,247, filed on Mar. 11, 1996, provisional application No. 60/012,878, filed on Mar. 5, 1996, provisional application No. 60/012,040, filed on Feb. 22, 1996, provisional application No. 60/012,027, filed on Feb. 21, 1996.

(51) Int. Cl.
    *H01R 12/00*    (2006.01)

(52) U.S. Cl. ........................................... 439/81

(58) Field of Classification Search .............. 439/66, 439/81; 324/754, 761; 174/261; 361/773, 361/774

See application file for complete search history.

(56) References Cited

U.S. PATENT DOCUMENTS

| | | |
|---|---|---|
| 3,379,937 A | 4/1968 | Shepherd et al. |
| 3,702,982 A | 11/1972 | Kelley et al. |
| 3,781,683 A | 12/1973 | Freed |
| 3,849,728 A | 11/1974 | Evans |
| 3,963,986 A | 6/1976 | Morton et al. |
| 4,032,058 A | 6/1977 | Riseman |
| 4,087,747 A | 5/1978 | Deegen et al. |
| 4,357,062 A | 11/1982 | Everett |
| 4,508,405 A | 4/1985 | Damon et al. |
| 4,522,893 A | 6/1985 | Bohlen et al. |
| 4,528,500 A | 7/1985 | Lightbody et al. |
| 4,553,192 A | 11/1985 | Babuka |
| 4,565,314 A | 1/1986 | Scholz |
| 4,636,722 A | 1/1987 | Ardezzone |
| 4,724,383 A | 2/1988 | Hart |
| 4,740,410 A | 4/1988 | Muller et al. |
| 4,811,081 A | 3/1989 | Lyden |
| 4,837,622 A | 6/1989 | Whann et al. |

| | | |
|---|---|---|
| 4,899,099 A | 2/1990 | Mendenhall et al. |
| 4,899,106 A | 2/1990 | Ogura |
| 4,918,032 A | 4/1990 | Jain et al. |
| 4,932,883 A | 6/1990 | Hsia et al. |
| 4,953,834 A | 9/1990 | Ebert et al. |
| 4,965,865 A | 10/1990 | Trenary |
| 4,972,580 A | 11/1990 | Nakamura |
| 4,983,907 A | 1/1991 | Crowley |
| 4,998,885 A | 3/1991 | Beaman |
| 5,172,050 A | 12/1992 | Swapp |
| 5,175,491 A | 12/1992 | Ewers |
| 5,187,020 A | 2/1993 | Kwon et al. |
| 5,191,708 A | 3/1993 | Kasukabe et al. |
| 5,210,939 A | 5/1993 | Mallik et al. |
| 5,225,777 A | 7/1993 | Bross et al. |
| 5,236,118 A | 8/1993 | Bower et al. |
| 5,276,395 A | 1/1994 | Malloy |
| 5,278,442 A | 1/1994 | Prinz et al. |
| 5,311,405 A | 5/1994 | Tribbey et al. |
| 5,312,456 A | 5/1994 | Reed et al. |
| 5,371,654 A | 12/1994 | Beaman et al. |
| 5,373,627 A | 12/1994 | Grebe |
| 5,393,375 A | 2/1995 | MacDonald et al. |
| 5,395,253 A | 3/1995 | Crumly |
| 5,418,471 A | 5/1995 | Kardos |
| 5,422,574 A | 6/1995 | Kister |
| 5,440,231 A | 8/1995 | Sugai |
| 5,473,510 A | 12/1995 | Dozier, II |
| 5,476,211 A | 12/1995 | Khandros |
| 5,476,818 A | 12/1995 | Yanof |
| 5,477,160 A | 12/1995 | Love |
| 5,491,426 A | 2/1996 | Small |
| 5,495,667 A | 3/1996 | Farnsworth et al. |
| 5,497,079 A | 3/1996 | Yamada et al. |
| 5,525,912 A | 6/1996 | Momohara |
| 5,534,784 A | 7/1996 | Lum et al. |
| 5,555,422 A | 9/1996 | Nakano |
| 5,569,272 A | 10/1996 | Reed et al. |
| 5,576,630 A | 11/1996 | Fujita |
| 5,593,322 A | 1/1997 | Swamy et al. |
| 5,601,740 A | 2/1997 | Eldridge et al. |
| 5,629,631 A | 5/1997 | Perry et al. |
| 5,635,846 A * | 6/1997 | Beaman et al. ............. 324/754 |
| 5,657,207 A | 8/1997 | Schreiber et al. |
| 5,672,978 A | 9/1997 | Kimura |
| 5,691,650 A * | 11/1997 | Sugai .......................... 324/755 |
| 5,736,850 A | 4/1998 | Legal |
| 5,741,144 A | 4/1998 | Elco et al. |
| 5,772,451 A | 6/1998 | Dozier, II et al. |
| 5,786,701 A | 7/1998 | Pedder |
| 5,806,181 A | 9/1998 | Khandros et al. |
| 5,820,014 A | 10/1998 | Dozier, II et al. |
| 5,821,763 A | 10/1998 | Beanman et al. |
| 5,829,128 A | 11/1998 | Eldridge et al. |
| 5,832,601 A | 11/1998 | Eldridge et al. |
| 5,864,946 A | 2/1999 | Eldridge et al. |
| 5,914,614 A | 6/1999 | Beaman et al. |
| 5,917,707 A | 6/1999 | Khandros et al. |
| 5,920,200 A | 7/1999 | Pendse et al. |
| 5,923,178 A | 7/1999 | Higgins et al. |
| 5,974,662 A | 11/1999 | Eldridge et al. |
| 5,994,152 A | 11/1999 | Khandros et al. |
| 5,998,864 A | 12/1999 | Khandros et al. |
| 6,008,543 A | 12/1999 | Iwabuchi |
| 6,029,344 A | 2/2000 | Khandros et al. |
| 6,050,829 A | 4/2000 | Eldridge et al. |
| 6,053,395 A | 4/2000 | Sasaki |
| 6,064,213 A | 5/2000 | Khandros et al. |
| 6,110,823 A | 8/2000 | Eldridge et al. |
| 6,133,744 A | 10/2000 | Yojima et al. |
| 6,174,744 B1 | 1/2001 | Watanabe et al. |
| 6,184,053 B1 | 2/2001 | Eldridge et al. |
| 6,229,324 B1 | 5/2001 | Akram et al. |
| 6,336,269 B1 | 1/2002 | Eldridge et al. |
| 6,640,415 B2 | 11/2003 | Eslamy et al. |
| 6,690,185 B1 | 2/2004 | Khandros et al. |
| 6,741,085 B1 | 5/2004 | Khandros et al. |
| 7,140,883 B2 | 11/2006 | Khandros et al. |
| 2003/0192176 A1 | 10/2003 | Eldridge et al. |
| 2004/0058487 A1 | 3/2004 | Eslamy et al. |

FOREIGN PATENT DOCUMENTS

| | | |
|---|---|---|
| DE | 4237591 | 5/1994 |
| DE | 19610123 | 10/1997 |
| EP | 0061615 | 3/1982 |
| EP | 0369112 | 7/1989 |
| EP | 460822 | 12/1991 |
| JP | 54-146581 | 11/1979 |
| JP | 62-179073 | 12/1987 |
| JP | 63-268285 | 11/1988 |
| JP | 63-273328 | 11/1988 |
| JP | 01-313969 | 12/1989 |
| JP | 02-144869 | 2/1990 |
| JP | 03-159146 | 7/1991 |
| JP | 05-256874 | 10/1993 |
| JP | 06-265575 | 9/1994 |
| JP | 06-342600 | 12/1994 |
| JP | 06-349904 | 12/1994 |
| JP | 07-63787 | 3/1995 |
| JP | 07-94558 | 4/1995 |
| JP | 08-15318 | 1/1996 |
| WO | WO 91/12706 | 8/1991 |
| WO | WO 96/15458 | 5/1996 |
| WO | WO 96/38858 | 12/1996 |
| WO | WO 97/43653 | 11/1997 |
| WO | WO 97/43656 | 11/1997 |
| WO | WO 98/21597 | 5/1998 |

OTHER PUBLICATIONS

U.S. Appl. No. 09/327,116, filed Jun. 7, 1999, Eslamy et al.

Humenik, "Flexible Probe Contact," IBM Technical Disclosure Bulletin, vol. 22, No. 6, p. 2286, Nov. 1979.

Emsworth, "High Density Probe Assembly," 2244 Research Disclosure (1992) Jan., No. 333.

Burbank et al., "Automatic Test Equipment Translator Board", IBM Technical Disclosure Bulletin, vol. 21, No. 4, pp. 1404-1405, Sep. 1997.

Renz, U., "Multipoint Test Probe for Printed Cards", IBM Technical Disclosure Bulletin, vol. 17, No. 2, pp. 459-460, Jul. 1974.

Renz, U., "Test Probe Contact Grid Translator Board", IBM Technical Disclosure Bulleting, vol. 21, No. 8, pp. 3235-3236, Jan. 1979.

Soejima, "New Probe Microstructure for Full-Wafer Contact-Probe Cards," 1999 IEEE, 1999 Electronic Components and Technology Conference, 6 pages (1999).

* cited by examiner

*Primary Examiner*—Neil Abrams
(74) *Attorney, Agent, or Firm*—N. Kenneth Burraston

(57) ABSTRACT

An interconnection apparatus and a method of forming an interconnection apparatus. Contact structures are attached to or formed on a first substrate. The first substrate is attached to a second substrate, which is larger than the first substrate. Multiple such first substrates may be attached to the second substrate in order to create an array of contact structures. Each contact structure may be elongate and resilient and may comprise a core that is over coated with a material that imparts desired structural properties to the contact structure.

18 Claims, 13 Drawing Sheets

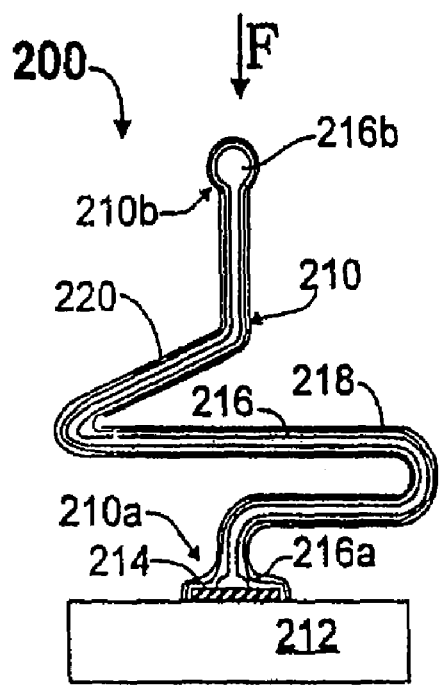
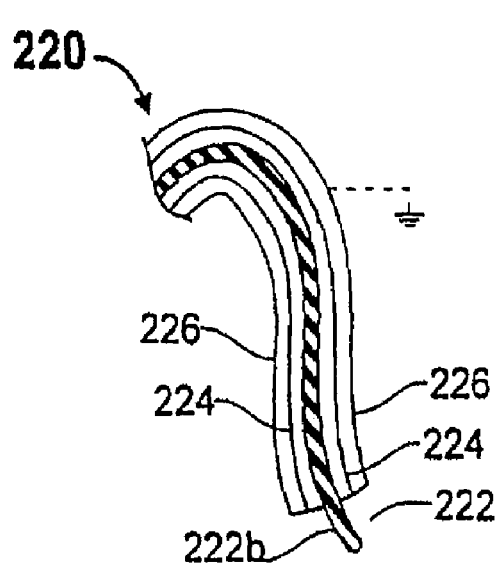
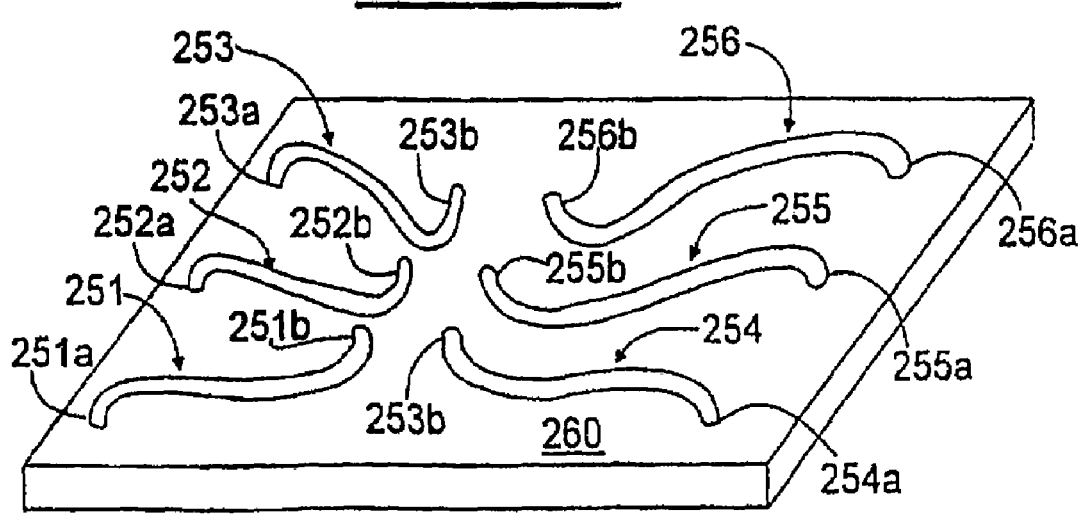

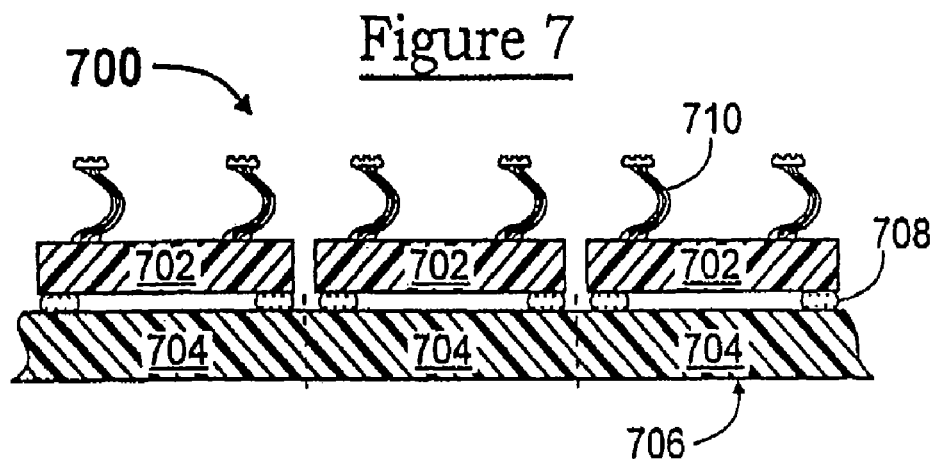
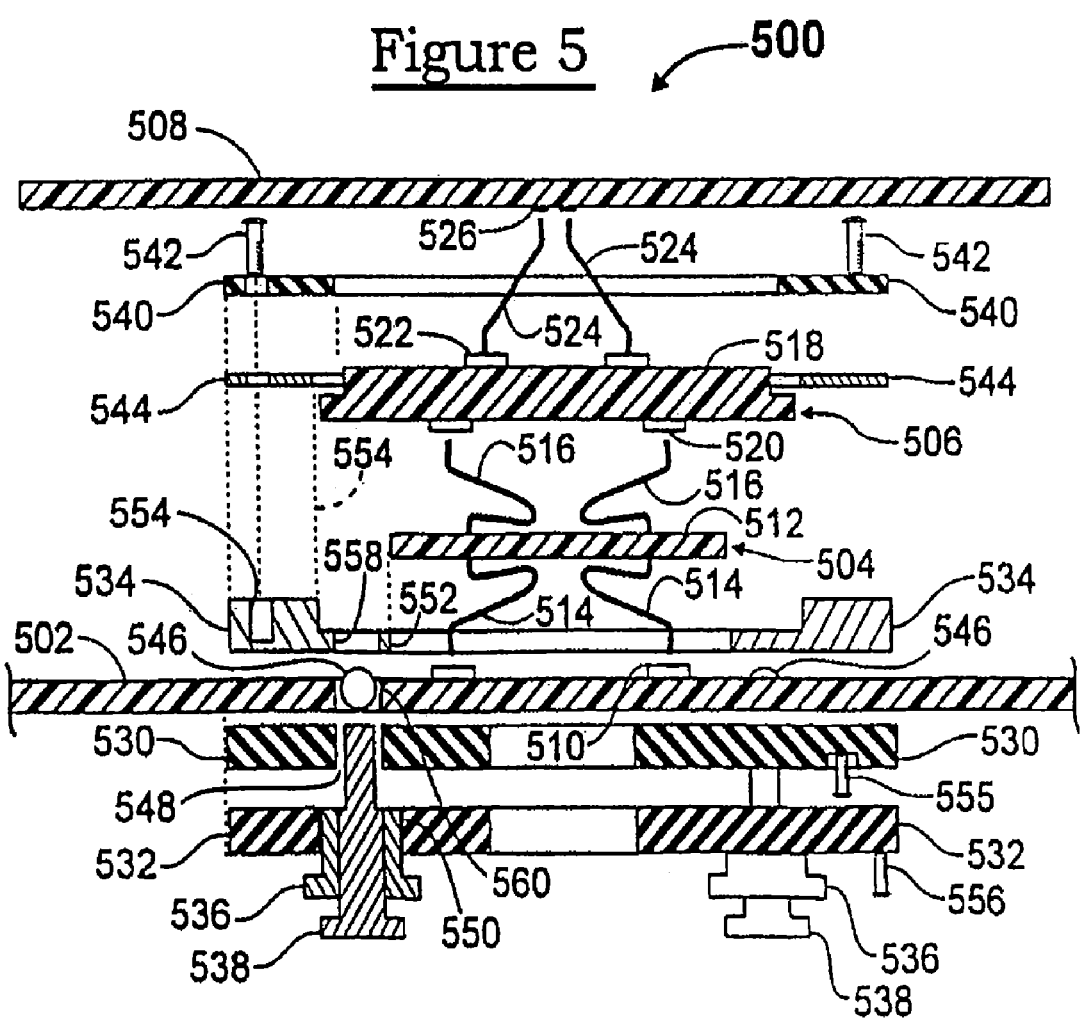

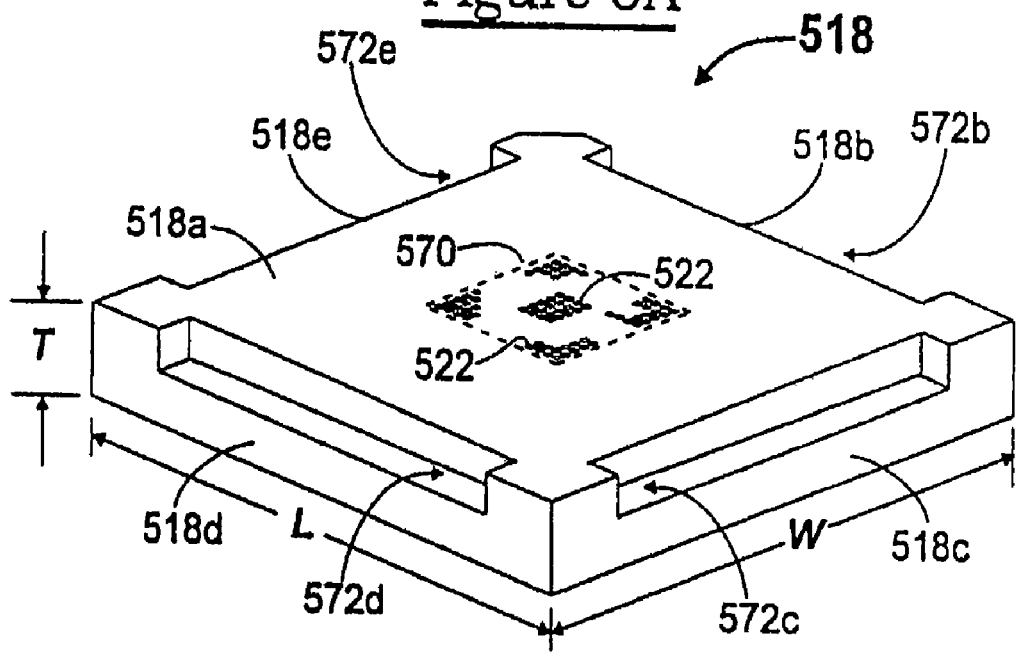
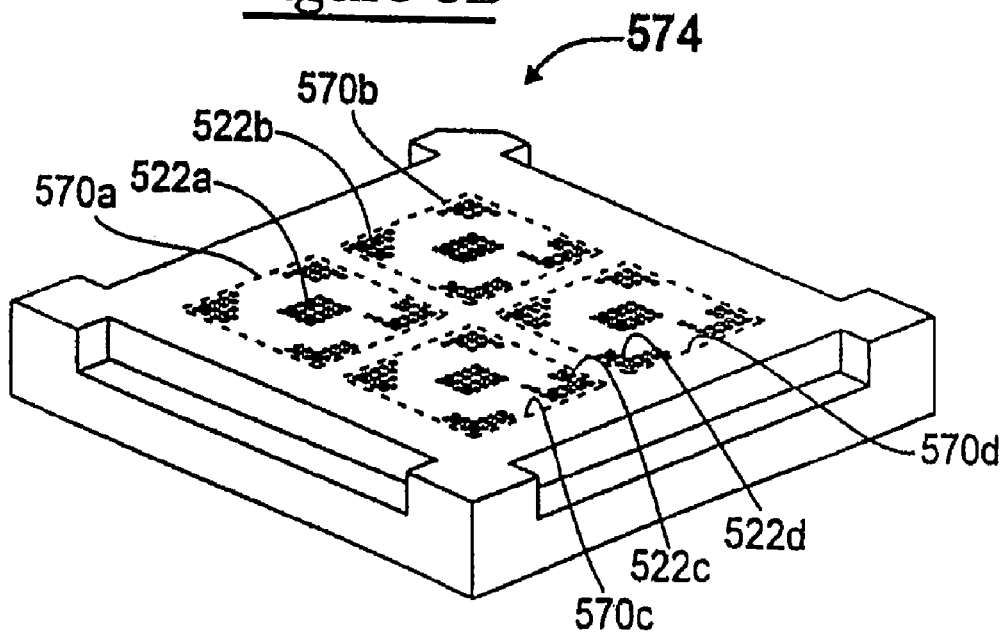

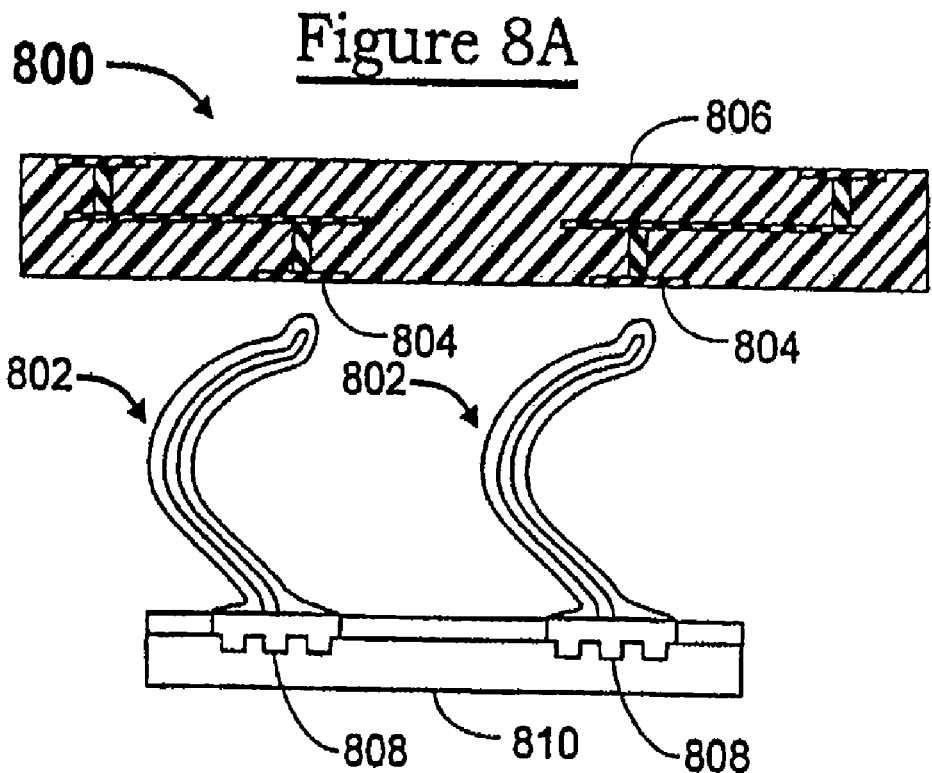
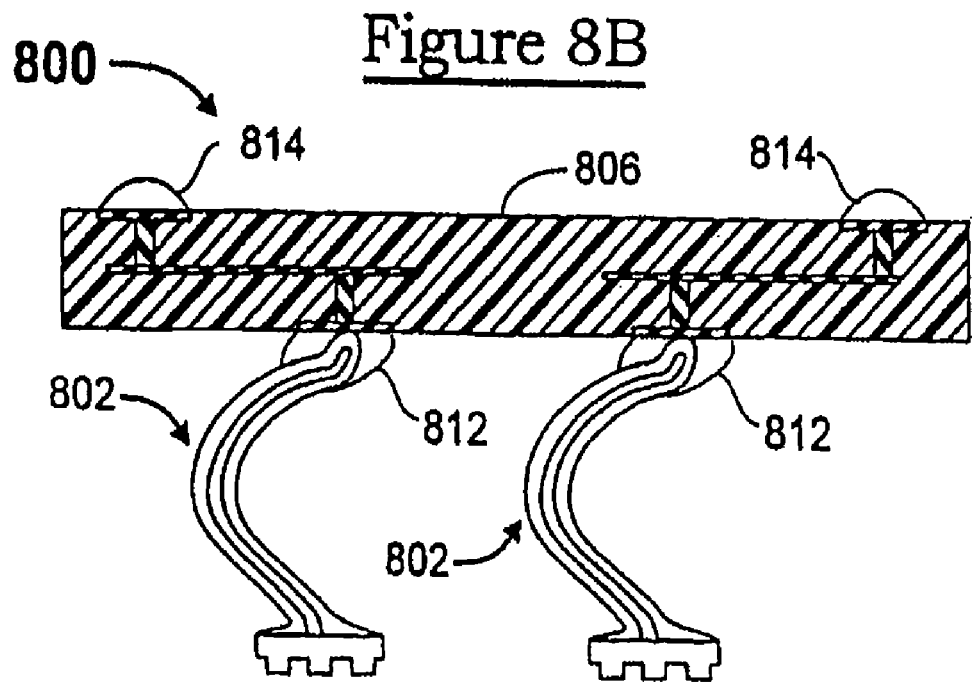

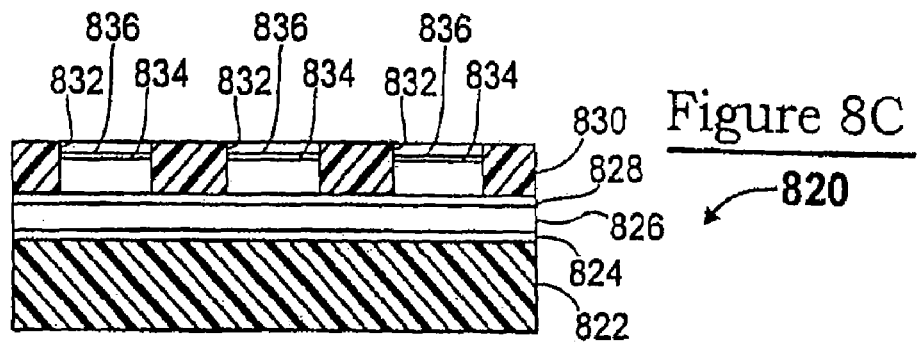
Figure 8C
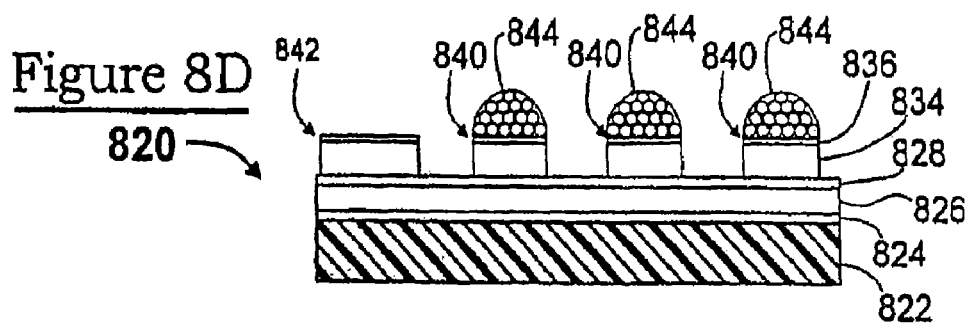
Figure 8D
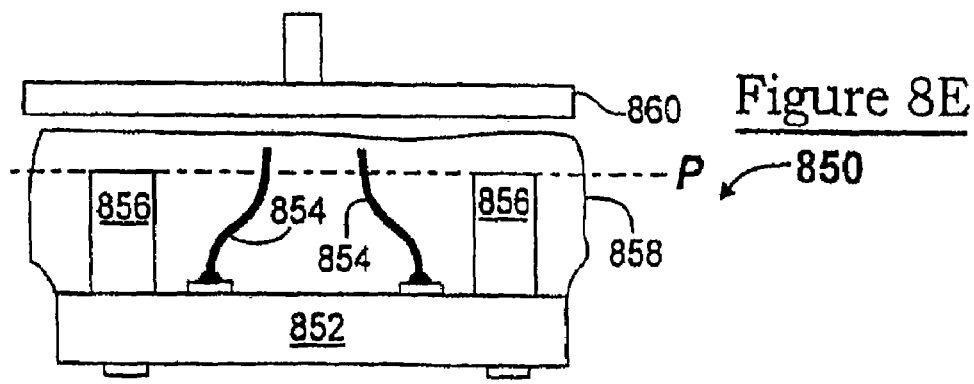
Figure 8E
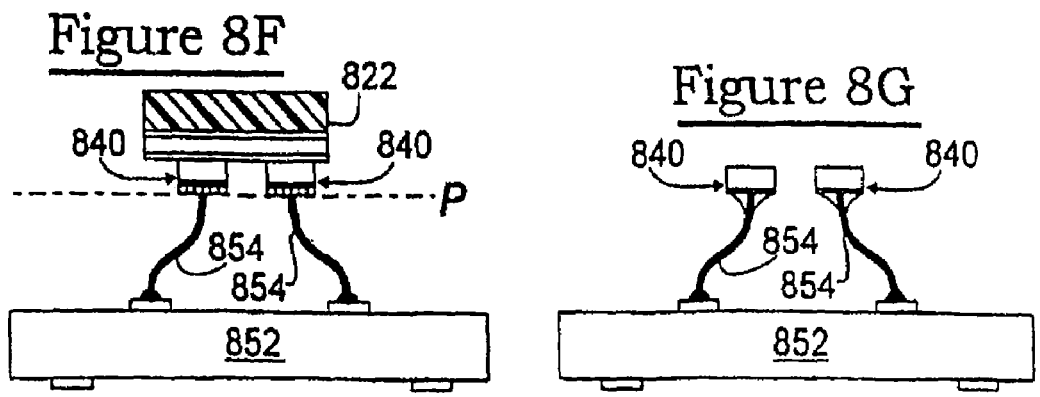
Figure 8F
Figure 8G

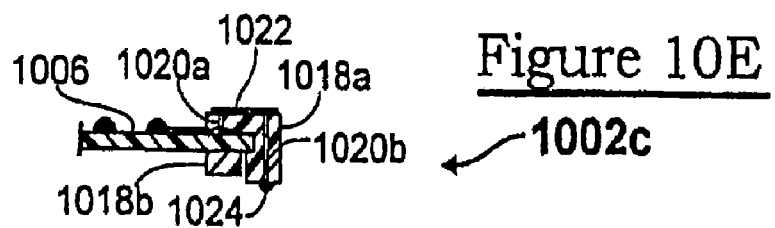
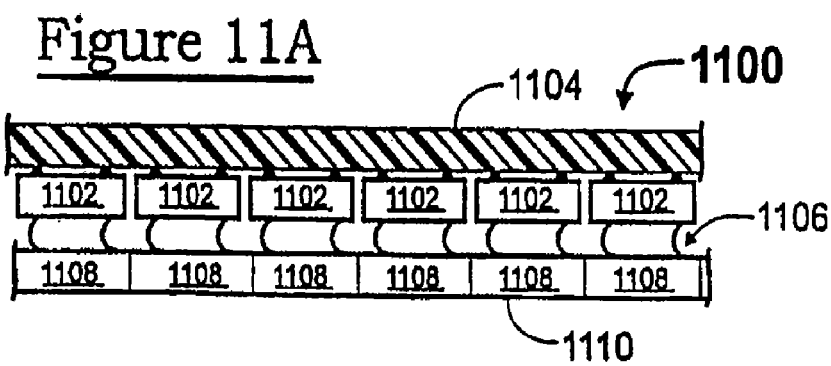
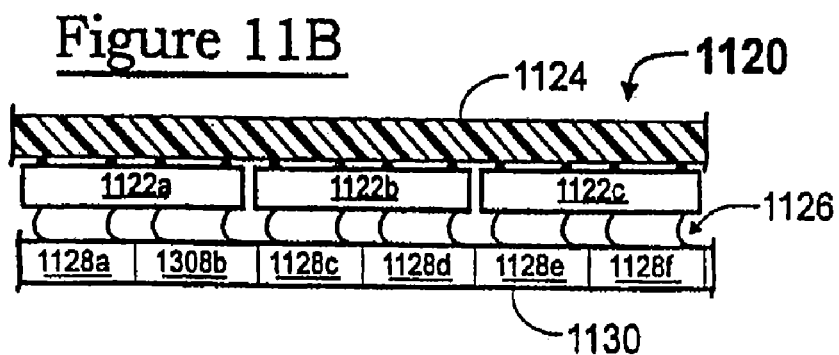
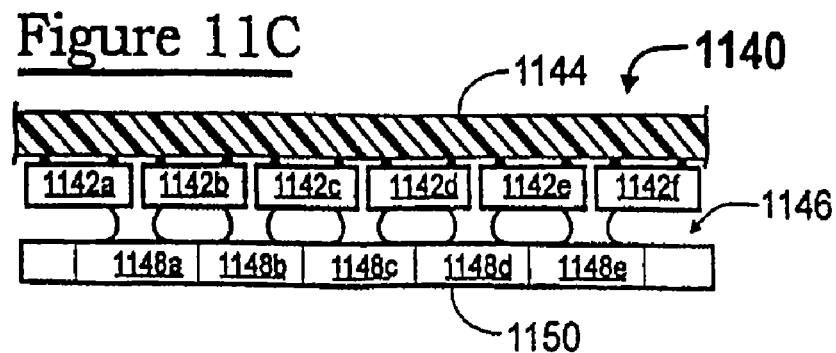

CONTACT CARRIERS (TILES) FOR POPULATING LARGER SUBSTRATES WITH SPRING CONTACTS

CROSS-REFERENCE TO RELATED APPLICATIONS

This patent application is a continuation of U.S. patent application Ser. No. 10/692,114 filed Oct. 23, 2003 (now U.S. Pat. No. 7,140,883), which is a continuation of U.S. patent application Ser. No. 08/994,799 filed Dec. 19, 1997 (now U.S. Pat. No. 6,741,085), which is a continuation of U.S. patent application Ser. No. 08/789,147 filed Jan. 24, 1997 (now U.S. Pat. No. 5,806,181), which is a continuation-in-part of U.S. patent application Ser. No. 08/452,255 (hereinafter "PARENTCASE") filed 26 May 1995 (now U.S. Pat. No. 6,336,269), which is a continuation-in-part of U.S. patent application Ser. No. 08/340,144 filed 15 Nov. 1994 (now U.S. Pat. No. 5,917,707), which is a continuation-in-part of U.S. patent application Ser. No. 08/152,812 filed 16 Nov. 1993 (now U.S. Pat. No. 5,476,211, 19 Dec. 1995), all of which are incorporated by reference herein.

U.S. patent application Ser. No. 08/789,147 is also a continuation-in-part of the following U.S. patent application Ser. Nos.:

08/526,246 filed 21 Sep. 1995 now abandoned;
08/533,584 filed 18 Oct. 1995 (now U.S. Pat. No. 5,772,451);
08/554,902 filed 9 Nov. 1995 (now U.S. Pat. No. 5,974,662);
08/558,332 filed 15 Nov. 1995 (now U.S. Pat. No. 5,829,128);
08/573,945 filed 18 Dec. 1995 (now U.S. Pat. No. 5,601,740);
08/584,981 filed 11 Jan. 1996 (now U.S. Pat. No. 5,820,014); and
08/602,179 filed 15 Feb. 1996 now abandoned all of which are continuations-in-part of the aforementioned PARENT CASE, and all of which are incorporated by reference herein. U.S. patent application Ser. No. 08/789,147 also claims the benefit of the following U.S. patent application Ser. Nos.:

60/012,027 filed 21 Feb. 1996;
60/012,040 filed 22 Feb. 1996;
60/012,878 filed 5 Mar. 1996;
60/013,247 filed 11 Mar. 1996; and
60/005,189 filed 17 May 1996 all of which are incorporated by reference herein.

TECHNICAL FIELD OF THE INVENTION

The invention relates to making temporary, pressure connections between electronic components and, more particularly, to techniques for performing test and burn-in procedures on semiconductor devices prior to their packaging, preferably prior to the individual semiconductor devices being singulated from a semiconductor wafer.

BACKGROUND OF THE INVENTION

Techniques of making pressure connections with composite interconnection elements (resilient contact structures) have been discussed in commonly-owned, copending U.S. patent application Ser. No. 08/450,255 filed 26 May 1995 ("PARENT CASE").

As discussed in commonly-owned, copending U.S. patent application Ser. No. 08/554,902 filed 09 Nov. 1995, individual semiconductor (integrated circuit) devices (dies) are typically produced by creating several identical devices on a semiconductor wafer, using known techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional).

It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond pads) on the dies. In this manner, the semiconductor dies can be tested and exercised, prior to singulating the dies from the wafer.

A conventional component of a wafer tester is a "probe card" to which a plurality of probe elements are connected—tips of the probe elements effecting the pressure connections to the respective bond pads of the semiconductor dies.

Certain difficulties are inherent in any technique for probing semiconductor dies. For example, modern integrated circuits include many thousands of transistor elements requiring many hundreds of bond pads disposed in close proximity to one another (e.g., 5 mils center-to-center). Moreover, the layout of the bond pads need not be limited to single rows of bond pads disposed close to the peripheral edges of the die (See, e.g., U.S. Pat. No. 5,453,583).

To effect reliable pressure connections between the probe elements and the semiconductor die one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein, which discloses a high density epoxy ring probe card including a unitary printed circuit board having a central opening adapted to receive a preformed epoxy ring array of probe elements.

Generally, prior art probe card assemblies include a plurality of tungsten needles (probe elements) extending as cantilevers from a surface of a probe card. The tungsten needles may be mounted in any suitable manner to the probe card, such as by the intermediary of an epoxy ring, as discussed hereinabove. Generally, in any case, the needles are wired to terminals of the probe card through the intermediary of a separate and distinct wire connecting the needles to the terminals of the probe card.

Probe cards are typically formed as circular rings, with hundreds of probe elements (needles) extending from an inner periphery of the ring (and wired to terminals of the probe card). Circuit modules, and conductive traces (lines) of preferably equal length, are associated with each of the probe elements. This ring-shape layout makes it difficult, and in some cases impossible, to probe a plurality of unsingulated semiconductor dies (multiple sites) on a wafer, especially when the bond pads of each semiconductor die are arranged in other than two linear arrays along two opposite edges of the semiconductor die.

Wafer testers may alternately employ a probe membrane having a central contact bump (probe element) area, as is discussed in U.S. Pat. No. 5,422,574, entitled LARGE SCALE PROTRUSION MEMBRANE FOR SEMICON- DUCTOR DEVICES UNDER TEST WITH VERY HIGH PIN COUNTS, incorporated by reference herein. As noted in this patent, "A test system typically comprises a test controller for executing and controlling a series of test programs, a wafer dispensing system for mechanically handling and positioning wafers in preparation for testing and a probe card for maintaining an accurate mechanical contact with the device-under-test (DUT)." (column 1, lines 41-46).

Additional references, incorporated by reference herein, as indicative of the state of the art in testing semiconductor devices, include U.S. Pat. No. 5,442,282 (TESTING AND EXERCISING INDIVIDUAL UNSINGULATED DIES ON A WAFER); U.S. Pat No. 5,382,898 (HIGH DENSITY PROBE CARD FOR TESTING ELECTRICAL CIRCUITS); U.S. Pat. No. 5,378,982 TEST PROBE FOR PANEL HAVING AN OVERLYING PROTECTIVE MEMBER ADJACENT PANEL CONTACTS); U.S. Pat. No. 5,339,027 (RIGID-FLEX CIRCUITS WITH RAISED FEATURES AS IC TEST PROBES); U.S. Pat. No. 5,180,977 (MEMBRANE PROBE CONTACT BUMP COMPLIANCY SYSTEM); U.S. Pat. No. 5,066,907 (PROBE SYSTEM FOR DEVICE AND CIRCUIT TESTING); U.S. Pat. No. 4,757,256 (HIGH DENSITY PROBE CARD); U.S. Pat. No. 4,161,692 (PROBE DEVICE FOR INTEGRATED CIRCUIT WAFERS); and U.S. Pat. No. 3,990,689 (ADJUSTABLE HOLDER ASSEMBLY FOR POSITIONING A VACUUM CHUCK).

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween.

Interconnection elements intended to make pressure contact with terminals of an electronic component are referred to herein as "springs" or "spring elements". Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Probe elements (other than contact bumps of membrane probes) are a class of spring elements of particular relevance to the present invention. Prior art probe elements are commonly fabricated from tungsten, a relatively hard (high yield strength) material. When it is desired to mount such relatively hard materials to terminals of an electronic component, relatively "hostile" (e.g., high temperature) processes such as brazing are required. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process. However, both solder and gold are relatively soft (low yield strength) materials which will not function well as spring elements.

A subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. Patents, incorporated by reference herein, are cited as being of general interest vis-a-vis making connections, particularly pressure connections, to electronic components: U.S. Pat. No. 5,386,344 (FLEX CIRCUIT CARD ELASTOMERIC CABLE CONNECTOR ASSEMBLY); U.S. Pat. No. 5,336,380 (SPRING BIASED TAPERED CONTACT ELEMENTS FOR ELECTRICAL CONNECTORS AND INTEGRATED CIRCUIT PACKAGES); U.S. Pat. No. 5,317,479 (PLATED COMPLIANT LEAD); U.S. Pat. No. 5,086,337 (CONNECTING STRUCTURE OF ELECTRONIC PART AND ELECTRONIC DEVICE USING THE STRUCTURE); U.S. Pat. No. 5,067,007 (SEMICONDUCTOR DEVICE HAVING LEADS FOR MOUNTING TO A SURFACE OF A PRINTED CIRCUIT BOARD); U.S. Pat. No. 4,989,069 (SEMICONDUCTOR PACKAGE HAVING LEADS THAT BREAKAWAY FROM SUPPORTS); U.S. Pat. No. 4,893,172 (CONNECTING STRUCTURE FOR ELECTRONIC PART AND METHOD OF MANUFACTURING THE SAME); U.S. Pat. No. 4,793,814 (ELECTRICAL CIRCUIT BOARD INTERCONNECT); U.S. Pat. No. 4,777,564 (LEADFORM FOR USE WITH SURFACE MOUNTED COMPONENTS); U.S. Pat. No. 4,764,848 (SURFACE MOUNTED ARRAY STRAIN RELIEF DEVICE); U.S. Pat. No. 4,667,219 (SEMICONDUCTOR CHIP INTERFACE); U.S. Pat. No. 4,642,889 (COMPLIANT INTERCONNECTION AND METHOD THEREFOR); U.S. Pat. No. 4,330,165 (PRESS-CONTACT TYPE INTERCONNECTORS); U.S. Pat. No. 4,295,700 (INTERCONNECTORS); U.S. Pat. No. 4,067,104 (METHOD OF FABRICATING AN ARRAY OF FLEXIBLE METALLIC INTERCONNECTS FOR COUPLING MICROELECTRONICS COMPONENTS); U.S. Pat. No. 3,795,037 (ELECTRICAL CONNECTOR DEVICES); U.S. Pat. No. 3,616,532 (MULTILAYER PRINTED CIRCUIT ELECTRICAL INTERCONNECTION DEVICE); and U.S. Pat. No. 3,509,270 (INTERCONNECTION FOR PRINTED CIRCUITS AND METHOD OF MAKING SAME).

In the aforementioned PARENT CASE, techniques are disclosed for fabricating composite interconnection elements (resilient contact structures, spring elements) directly upon electronic components. In cases where a large number of such spring elements are required, failure to yield (successfully manufacture) but one of the great many spring elements may result in an entire component being defective (unusable or, at best, requiring extensive rework).

Moreover, in instances wherein it is desired to fabricate a great many spring contacts over a large surface area, for example to provide for full semiconductor wafer testing in one pass, it is difficult to find an appropriate (e.g., matched coefficient of thermal expansion) substrate to which the great many spring contacts can successfully be mounted.

BRIEF DESCRIPTION (SUMMARY) OF THE INVENTION

It is an object of the invention to provide an improved technique of mounting a large plurality of probe elements on an electronic component, such as a probe card, covering a large area and avoiding problems associated with yielding (successfully fabricating) the probe elements, particularly probe elements which are spring elements, directly on the electronic component.

It is an object of the present invention to provide a technique for providing electronic components, such as space transformer substrates and semiconductor devices with spring contacts, while avoiding problems (e.g., yield) associated with fabricating the spring contacts directly upon the electronic components.

According to the invention, probe elements such as spring contacts are pre-fabricated on individual spring contact carriers ("tiles"). A number of these tiles are mounted to another component (such as a space transformer substrate or a printed circuit board) in a defined relationship with one another, preferably so that the tips of the spring contacts are coplanar with one another. The tile substrates are preferably relatively inexpensive, and conducive to successfully yielding spring contacts. Terminals on an opposite surface of the tile are joined to terminals of an electronic component such as a space transformer substrate, or one or more semiconductor devices (including unsingulated semiconductor devices) by solder, z-axis conducting adhesive, or the like.

The spring contacts are preferably composite interconnection elements. However, any suitable spring contact may be tiled in the manner of the invention, such as monolithic spring contacts and membrane probe sections.

As used herein, the term "probe element" includes any element such as a composite interconnection element, spring contact, spring element, contact bump, or the like, suited to effect a pressure connection to terminals (e.g., bond pads) of an electronic component (e.g., a semiconductor die, including unsingulated semiconductor dies resident on a semiconductor wafer).

As used herein, the term "tile" includes any component having probe elements on a surface thereof, a plurality (preferably identical) of which can be mounted to a larger substrate, thereby avoiding fabricating said probe elements directly upon the larger substrate.

As used herein, the term "tile substrate" includes a solid substrate (e.g., 602, 902, 922,942, 962) as well as a frame (e.g., 1002, 1002a, 1002b, 1002c), or the like.

As used herein, the term "a larger substrate" is any substrate to which a plurality of tiles can be mounted, to the surface thereof. Generally, at least four tiles would be mounted to the larger substrate, dictating that the surface area of larger substrate would be at least four times as great as the surface area of an individual tile. This specifically includes the "space transformer" of a probe card assembly.

As may be used herein, a "spark" is an electrical discharge.

According to an embodiment of the invention, a plurality of such tiles can be attached and connected to a single space transformer component of a probe card assembly to effect wafer-level (multiple site) testing, wherein an entire semiconductor wafer can be burned-in and/or tested in by making simultaneous pressure connections between the plurality of probe elements and a plurality of bond pads (terminals) of the semiconductor devices which are resident on the semiconductor wafer.

According to a feature of the invention, the tiles can be single layer substrates, or can be multilayer substrates effecting a degree of space-transformation.

According to a feature of the invention, a plurality of tiles having spring contact elements fabricated on a surface thereof can be fabricated from a single, inexpensive substrate such as a ceramic wafer, which is subsequently diced to result in a plurality of separate, preferably identical tiles which can be individually mounted to the surface of a space transformer or to the surface of a semiconductor wafer, or other electronic is component).

According to an aspect of the invention, in order to enhance self-alignment of one or more tiles to the corresponding surface of the electronic component to which they are mounted, the electronic component and the tile(s) are each provided with at least one solderable feature that, with solder disposed therebetween and during reflow heating, will provide enhanced momentum for effecting self-alignment of the tile substrate to the electronic component.

An advantage of the present invention is that tiles may be mounted directly to semiconductor devices, including fully-populated C4 dies with active devices, either prior to or after their singulation from a semiconductor wafer. In this manner, spring contact elements are readily mounted to semiconductor devices, while avoiding fabricating the spring contact elements directly upon the semiconductor devices.

An advantage of the present invention is that the tiles upon which the spring elements are fabricated can be an existing "C4" package having solder bumps on a surface opposite the spring elements. In this manner, the tiles can be mounted to the surface of an electronic component (e.g., space transformer, semiconductor wafer, or the like) by reflow heating.

An advantage to the technique of using tiles, rather than fabricating spring elements directly upon the surface of the electronic component is that the electronic component is readily re-worked, simply by replacing selected ones of the one or more tiles attached/connected thereto.

The present invention is applicable to using tiles to populate larger substrates, and the probe elements on the tiles may also be contact bumps of the type found in membrane probes.

According to a feature of the invention, semiconductor devices which have had spring contact elements mounted thereto in the aforementioned manner are readily tested and/or burned-in using a simple test fixture which may be as simple as a printed circuit board (PCB) having terminals (pads) arranged to mate (by pressure contact) with the tips of the spring contact elements.

The space transformer substrate with tiles mounted thereto is suitably employed as a component of a probe card assembly which includes a probe card (electronic component) having a top surface, a bottom surface and a plurality of terminals on the top surface thereof; an interposer (electronic component) having a top surface, a bottom surface, a first plurality of resilient contact structures extending from terminals on the bottom surface thereof and a second plurality of contact structures extending from terminals on the top surface thereof. The interposer is situated between the probe card and the space transformer, as described in commonly-owned, copending U.S. patent application Ser. No. 08/554,902.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied, to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various topographies can be disposed at the contact ends of the interconnection elements. (See also FIGS. 11A-11F of the PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electrolytic plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Preferably, the core is in the form of a wire. Alternatively, the core is a flat tab (conductive metallic ribbon).

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to the metallization (e.g., aluminum) of semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

According to an aspect of the invention, any of the resilient contact structures may be formed as at least two composite interconnection elements.

A particularly useful application for the present invention is to provide a method of probing (electrically contacting) a testable area of an electronic component a plurality of spring contact elements, by populating (mounting and connecting) a plurality of contact carriers (tile substrates) to a larger substrate and urging the large substrate and the electronic component towards on another so that spring contact elements extending from a surface of the tile substrates make contact with corresponding terminals on the testable area of the electronic component. The electronic component may be a semiconductor wafer, in which case the testable area would be a plurality of die sites on the semiconductor wafer. The ability of all of the spring contacts to make contact with a plurality of die sites, all at once, can facilitate such processes as wafer-level burn-in. However, it is not necessary that the entire electronic component be contacted at once. Advantages will accrue when a substantial portion, such as at least half, of the electronic component is contacted at once. The electronic component may also, for example, be a printed circuit board (PCB) or a liquid crystal display (LCD) panel.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

In the side views presented herein, often portions of the side view are presented in cross-section, for illustrative clarity. For example, in many of the views, the wire stem (core) is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

Figure 1A:
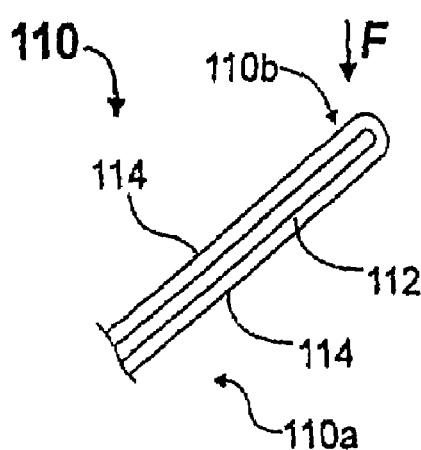

FIG. 1A is a cross-sectional view of a longitudinal portion, including one end, of a composite interconnection element, according to an embodiment of the invention.

Figure 1B:
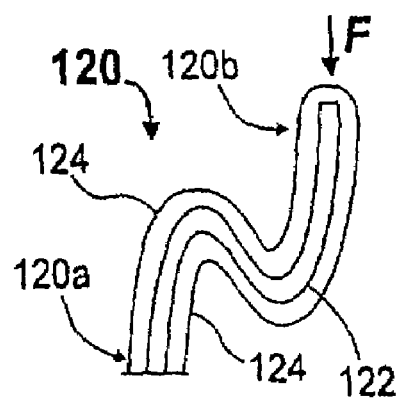

FIG. 1B is a cross-sectional view of a longitudinal portion, including one end, of a composite interconnection element, according to another embodiment of the invention.

Figure 1C:
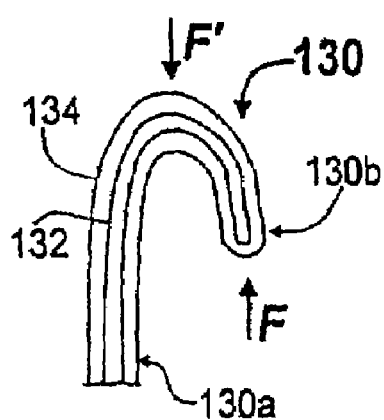

FIG. 1C is a cross-sectional view of a longitudinal portion, including one end of a composite interconnection element, according to another embodiment of the invention.

Figure 1D:
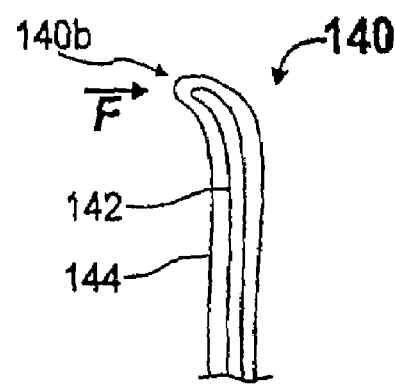

FIG. 1D is a cross-sectional view of a longitudinal portion, including one end of a composite interconnection element, according to another embodiment of the invention.

Figure 1E:
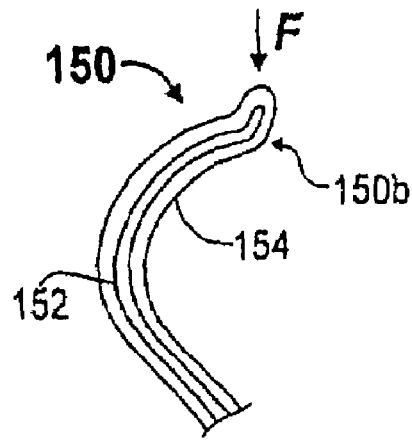

FIG. 1E is a cross-sectional view of a longitudinal portion, including one end of a composite interconnection element, according to another embodiment of the invention.

FIG. 2A is a cross-sectional view of a composite interconnection element mounted to a terminal of an electronic component and having a multi-layered shell, according to the invention.

FIG. 2B is a cross-sectional view of a composite interconnection element having a multi-layered shell, wherein an intermediate layer is of a dielectric material, according to the invention.

FIG. 2C is a perspective view of a plurality of interconnection elements, which may be composite interconnection elements, mounted to an electronic component (e.g., a probe card insert), according to the invention.

Figure 2D:
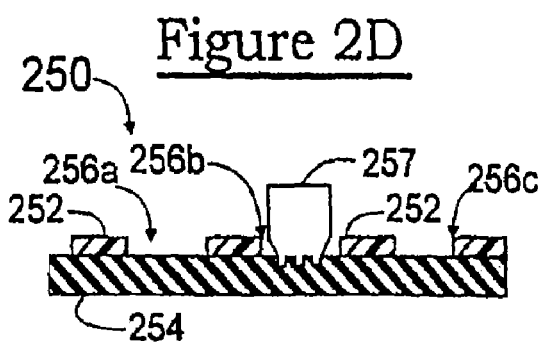

FIG. 2D is a cross-sectional view of an exemplary first step of a technique for manufacturing interconnection elements having textured tips, according to the invention.

Figure 2E:
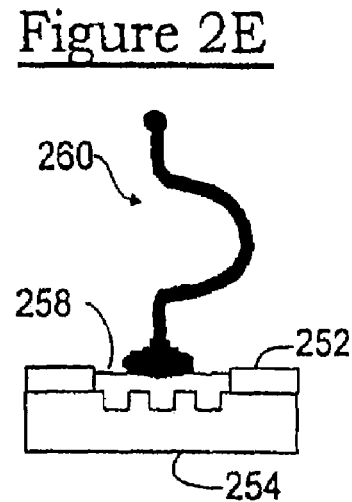

FIG. 2E is a cross-sectional view of an exemplary further step of the technique of FIG. 2D for manufacturing interconnection elements, according to the invention.

Figure 2F:
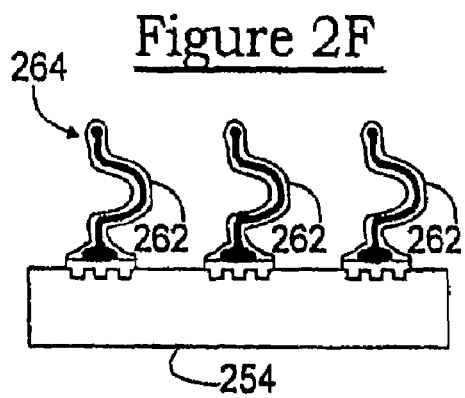

FIG. 2F is a cross-sectional view of an exemplary further step of the technique of FIG. 2E for manufacturing interconnection elements, according to the invention.

Figure 2G:
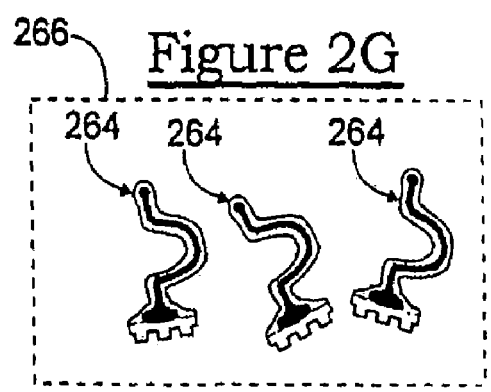

FIG. 2G is a cross-sectional view of an exemplary plurality of individual interconnection elements fabricated according to the technique of FIGS. 2D-2F, according to the invention.

Figure 2H:
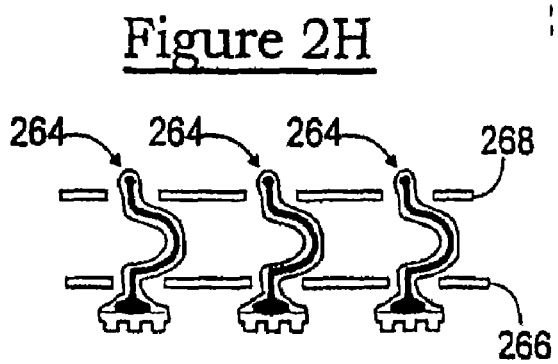

FIG. 2H is a cross-sectional view of an exemplary plurality of interconnection elements fabricated according to the technique of FIGS. 2D-2F, and associated in a prescribed spatial relationship with one another, according to the invention.

Figure 2I:
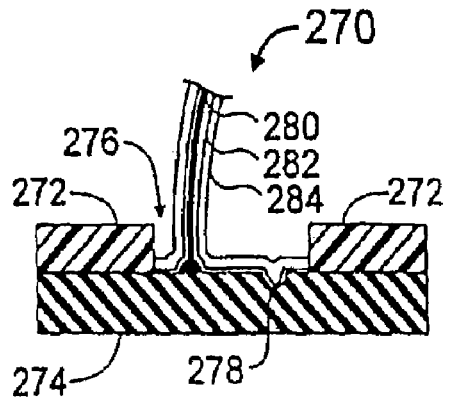

FIG. 2I is a cross-sectional view of an alternate embodiment for manufacturing interconnection elements, showing a one end of one element, according to the invention.

Figure 3:
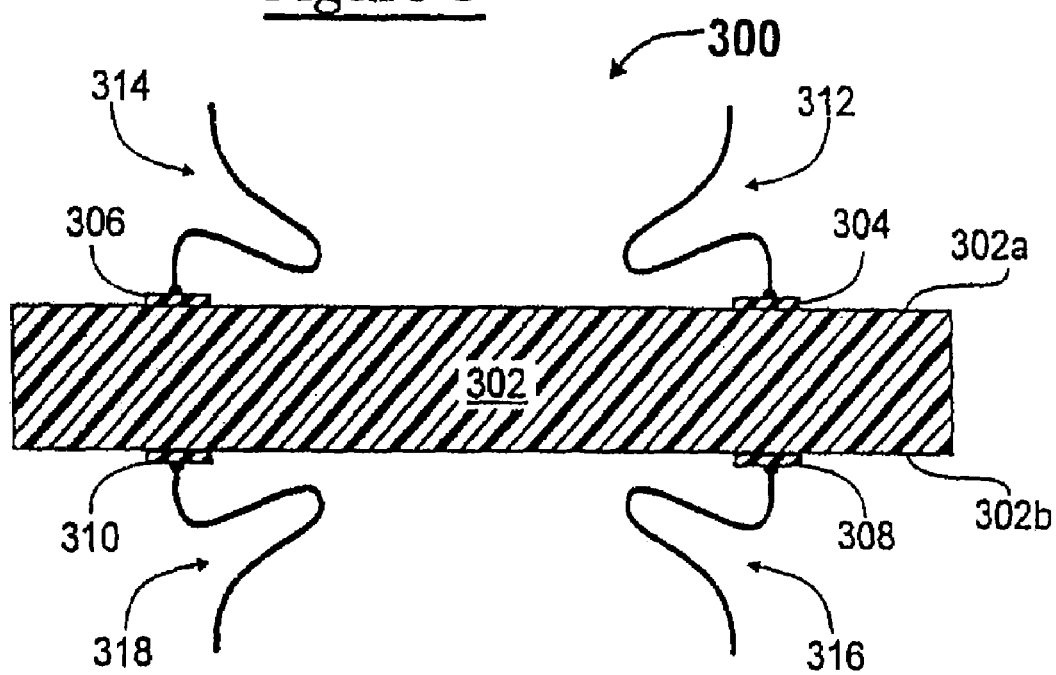

FIG. 3 is a cross-sectional view of a generic embodiment of an interposer component, according to the invention.

Figure 4:
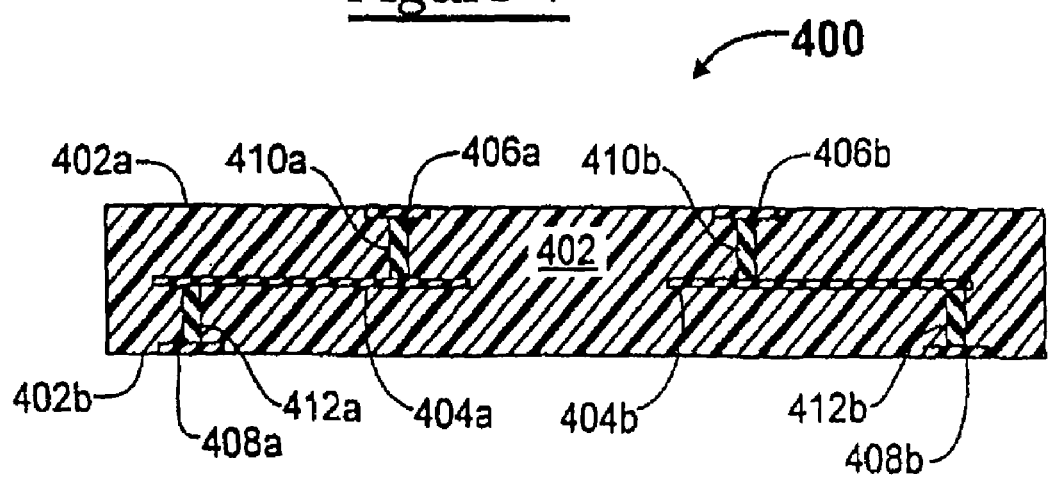

FIG. 4 is a cross-sectional view of a generic embodiment of a space transformer component, according to the invention.

FIG. 5 is an exploded view, partially in cross-section, of a probe card assembly, according to the invention.

FIG. 5A is a perspective view of a space transformer component suited for use in the probe card assembly of FIG. 5, according to the invention.

FIG. 5B is a perspective view of another space transformer component suited for use in the probe card assembly of FIG. 5, according to the invention.

Figure 6:
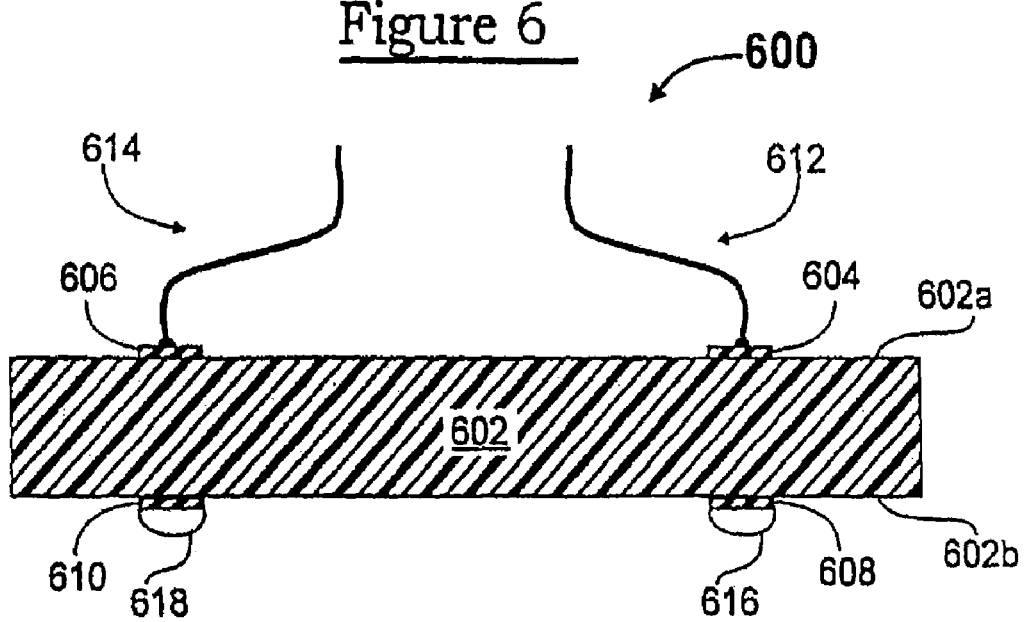

FIG. 6 is a cross-sectional view of an embodiment of a tile component, according to the present invention.

Figure 6A:
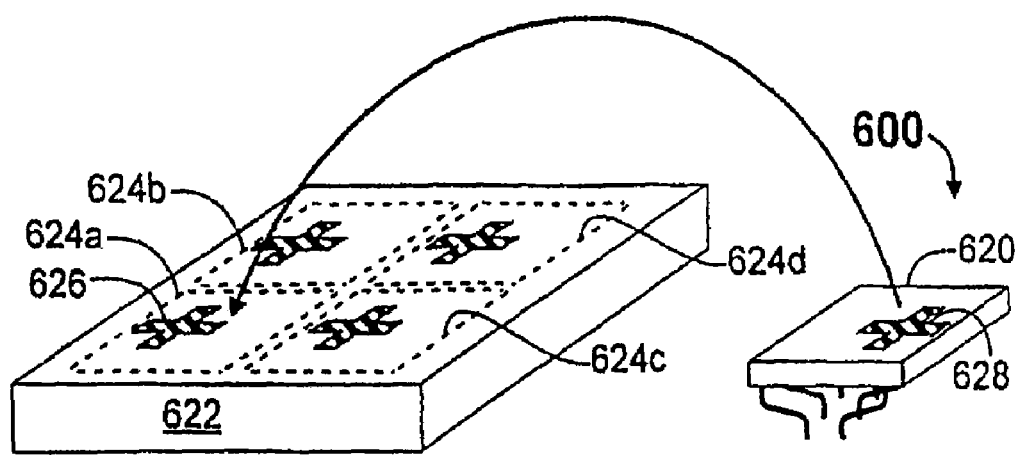

FIG. 6A is a perspective, exploded view of a technique for mounting a plurality of tile components to a space transformer component (larger substrate), according to the present invention.

FIG. 7 is a perspective view of an embodiment of applying one or more tile components to a larger substrate, such as an electronic component, such as a semiconductor wafer, according to the present invention.

FIG. 8A is a cross-sectional view of a technique for fabricating tile components, according to the present invention.

FIG. 8B is a cross-sectional view of a further step in the technique of FIG. 8A, according to the invention.

FIGS. 8C and 8D are cross-sectional views of a sacrificial substrate being prepared with tip-structures, for later mounting to tips of interconnection elements, according to the invention.

FIG. 8E is a side view, partially in cross-section and partially in full of another technique for fabricating tile substrate components, according to the present invention.

FIG. 8F is a side view, partially in cross-section and partially in full of the tile component of FIG. 8C being joined with the pre-fabricated tip structures of FIGS. 8C-8D, according to the present invention.

FIG. 8G is a side view, partially in cross-section and partially in full of a further step in joining tip structures to spring elements on the tile component of FIG. 8D, according to the invention.

Figure 9A:
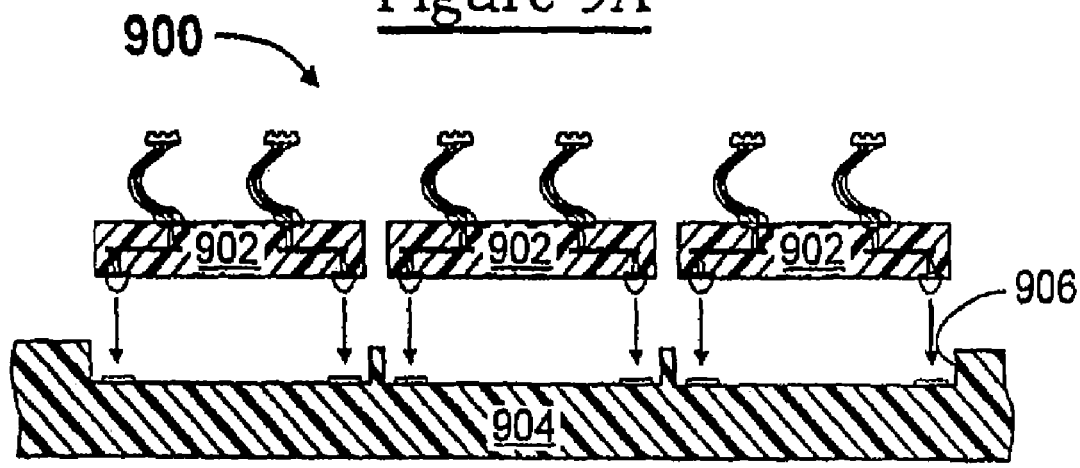

FIG. 9A is a cross-sectional view of a technique for maintaining a plurality of tile substrates in proper alignment with a larger substrate, according to the invention.

Figure 9B:
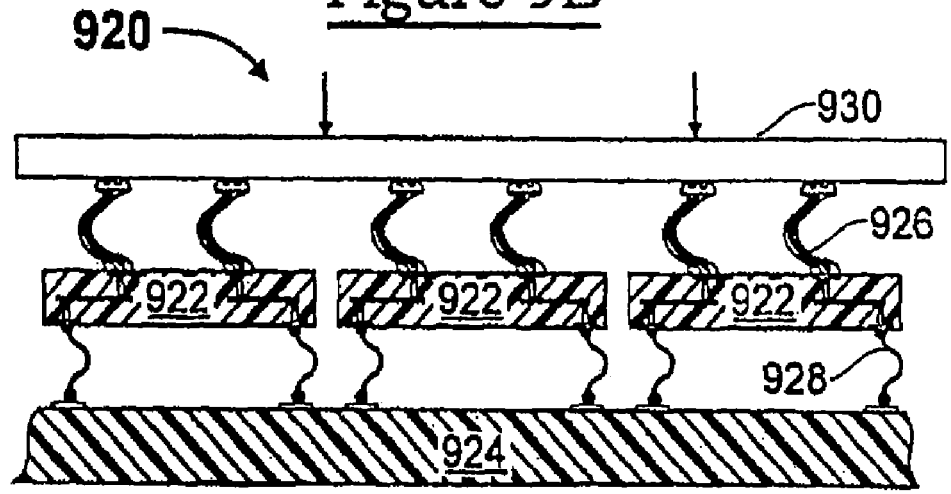

FIG. 9B is a cross-sectional view of another technique for maintaining a plurality of tile substrates in proper alignment with a larger substrate, according to the invention.

Figure 9C:
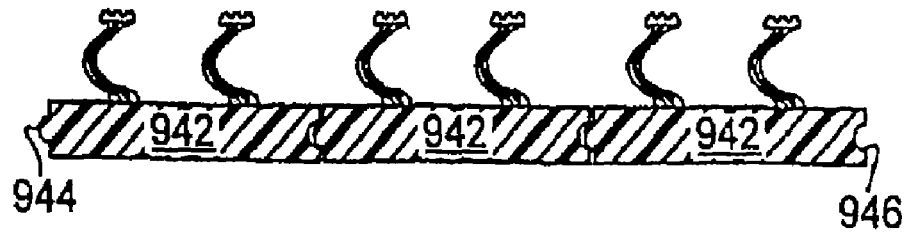

FIG. 9C is a cross-sectional view of another technique for maintaining a plurality of tile substrates in proper alignment with a larger substrate, according to the invention.

Figure 9D:
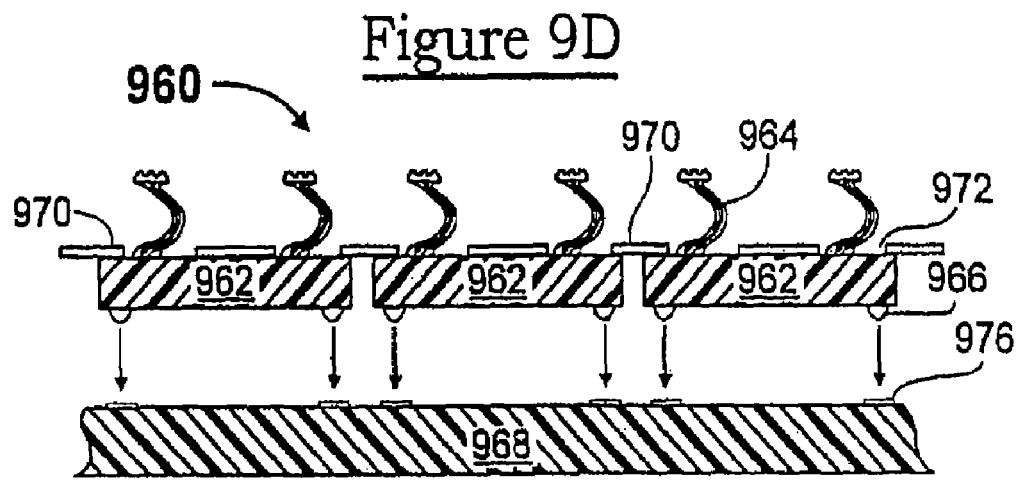

FIG. 9D is a cross-sectional view of another technique for maintaining a plurality of tile substrates in proper alignment with a larger substrate, according to the invention.

Figure 10A:
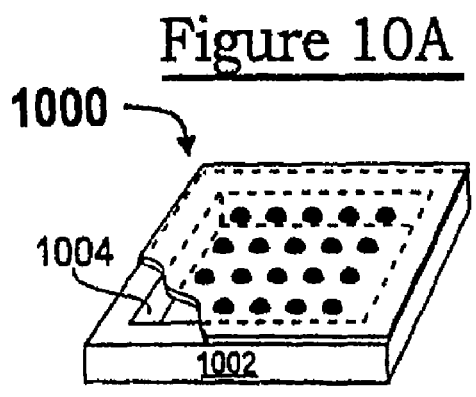

FIG. 10A is a perspective view of an embodiment of a spring contact carrier (tile), particularly for probe elements, according to the invention.

Figure 10B:
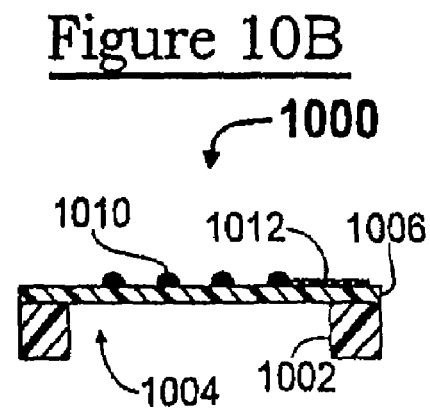

FIG. 10B is a cross-sectional view of the tile of FIG. 10A, according to the invention.

Figure 10C:
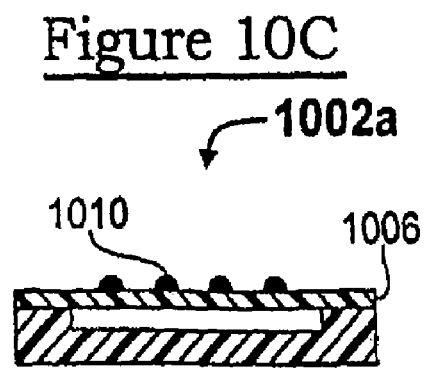

FIG. 10C is a cross-sectional view of another embodiment of a spring contact carrier (tile), particularly for probe elements, according to the invention.

Figure 10D:
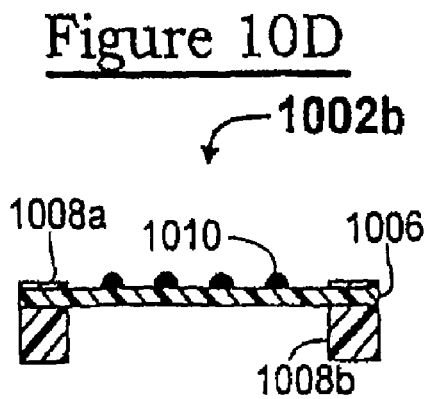

FIG. 10D is a cross-sectional view of another embodiment of a spring contact carrier (tile), particularly for probe elements, according to the invention.

FIG. 10E is a cross-sectional view of another embodiment of a spring contact carrier (tile), particularly for probe elements, according to the invention.

FIG. 11A is a cross-sectional view of an embodiment of a technique for accomplishing wafer-level burn-in, according to the invention.

FIG. 11B is a cross-sectional view of another embodiment of a technique for accomplishing wafer-level burn-in, according to the invention.

FIG. 11C is a cross-sectional view of another embodiment of a technique for accomplishing wafer-level burn-in, according to the invention.

Figure 12A:
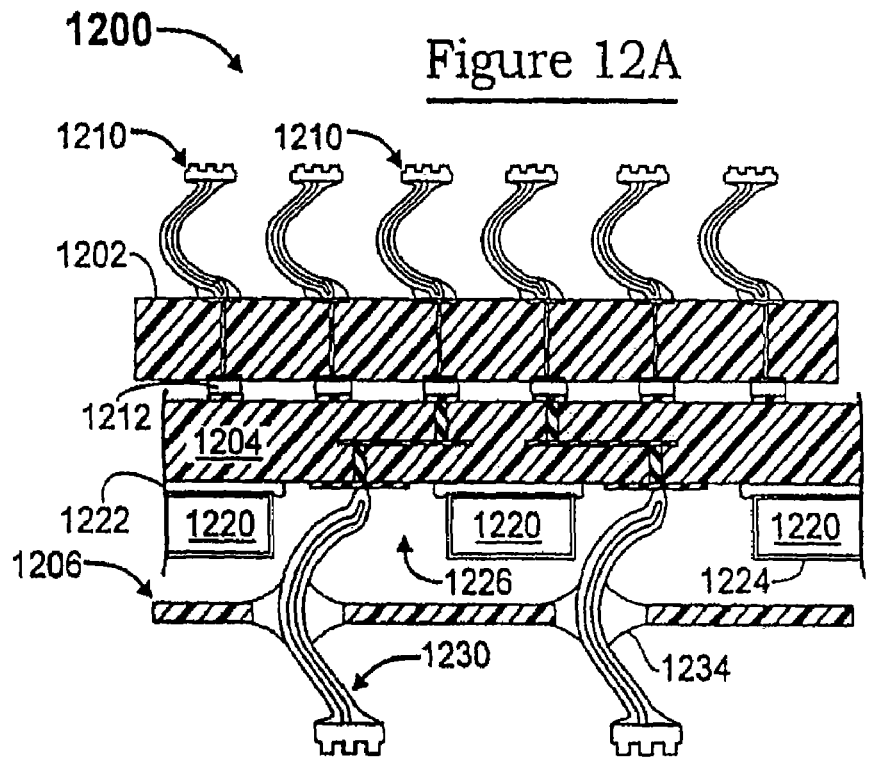

FIG. 12A is a cross-sectional view of a technique for mounting a plurality of tiles to a larger substrate (e.g., space transformer of the probe card assembly of the invention) and (a) altering the overall the thermal coefficient of expansion of this assembly (e.g., to match that of a component desired to be probed, such as a semiconductor wafer), and (b) connecting to the larger substrate (such as with an interposer of the probe card assembly of the invention), according to the invention.

Figure 12B:
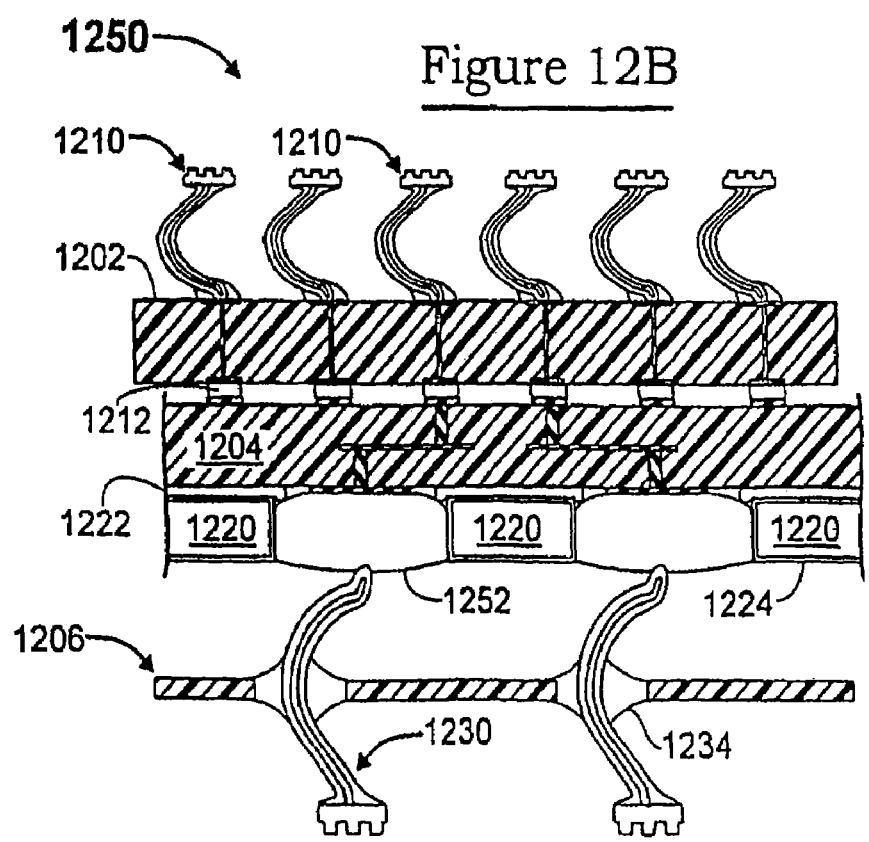

FIG. 12B is a cross-sectional view of another technique for mounting a plurality of tiles to a larger substrate (e.g., space transformer of the probe card assembly of the invention) and (a) altering the overall the thermal coefficient of expansion of this assembly (e.g., to match that of a component desired to be probed, such as a semiconductor wafer), and (b) connecting to the larger substrate (such as with an interposer of the probe card assembly of the invention), according to the invention.

DETAILED DESCRIPTION OF THE INVENTION

Commonly-owned, copending U.S. patent application Ser. No. 08/554,902 is directed to probe card assemblies, components thereof, and methods of using same. As will be evident from the description that follows, the use of resilient contact structures to effect pressure connections to terminals of an electronic component is essential. The resilient contact structures (spring elements, spring contacts, probe elements) are suitably implemented as "composite interconnection elements", such as have been described in the disclosure of commonly-owned, copending U.S. patent application Ser. No. 08/452,255, filed May 26, 1995 ("PARENT CASE"), incorporated by reference herein, but may also be "monolithic" (versus "composite") spring elements made of a material having a high yield strength per se (without the need for a high yield strength material overcoat).

The discussion that follows commences by summarizing a number of the techniques disclosed in the PARENT CASE in the discussions of FIGS. 1A-1E and 2A-2I.

An important aspect of the present invention is that a "composite" (versus "monolithic") interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the present invention. However, as mentioned above, the spring contacts of the present invention may be monolithic rather than composite FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005-0.0030 inches (0.001 inch=1 mil ~25 microns (µm)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025-0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130b, as indicated by the arrow labelled "F".

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counter-intuitive to plate over a gold core.

According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A-1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2-5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3-5 grams/mil. In use, 3-5 mils of deflection will result in a contact force of 9-25 grams. This example is useful in the context of a spring element for an interposer component.

(b) A gold wire core having a diameter of 1.0 mils is shaped to have an overall height of 35 mils, is plated with 1.25 mils of nickel (overall diameter=1.0+2×1.25=3.5 mils), and optionally receives a final overcoat of 50 microinches of gold. The resulting composite interconnection element exhibits a spring constant (k) of approximately 3 grams/mil, and is useful in the context of a spring element for a probe.

As will be illustrated in greater detail hereinbelow, the core need not have a round cross-section, but may rather be a flat tab (having a rectangular cross-section) extending from a sheet. It should be understood that, as used herein, the term "tab" is not to be confused with the term "TAB" (Tape Automated Bonding).

Additionally, it is within the scope of this invention that the cross-section of a wire stem (core) may be rectangular, or other non-circular shapes.

Multi-Layer Shells

FIG. 2A illustrates an embodiment 200 of an interconnection element 210 mounted to a terminal 214 of an electronic component 212. In this example, a soft (e.g., gold) wire core 216 is bonded (attached) at one end 216*a* to the terminal 214, is configured to extend from the terminal and have a spring shape (compare the shape shown in FIG. 1B), and is severed to have a free end 216*b*. Bonding, shaping and severing a wire in this manner is accomplished using wire-bonding equipment. The bond at the end 216*a* of the core covers only a relatively small portion of the exposed surface of the terminal 214.

A shell (overcoat) is disposed over the wire core 216 which, in this example, is shown as being multi-layered, having an inner layer 218 and an outer layer 220, both of which layers may suitably be applied by plating processes. One or more layers of the multi-layer shell is (are) formed of a hard material (such as nickel and its alloys) to impart a desired resiliency to the interconnection element 210. For example, the outer layer 220 may be of a hard material, and the inner layer may be of a material that acts as a buffer or barrier layer (or as an activation layer, or as an adhesion layer) in plating the hard material 220 onto the core material 216. Alternatively, the inner layer 218 may be the hard material, and the outer layer 220 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

Anchoring to the Terminal

FIG. 2A illustrates, in a general manner, another key feature of the invention—namely, that resilient interconnection element can be securely anchored to a terminal on an electronic component. The attached end 210*a* of the interconnection element will be subject to significant mechanical stress, as a result of a compressive force (arrow "F") applied to the free end 210*b* of the interconnection element.

As illustrated in FIG. 2A, the overcoat (218, 220) covers not only the core 216, but also the entire remaining (i.e., other than the bond 216*a*) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:
  interconnection elements mounted directly to silicon dies, eliminating the need for having a semiconductor package;
  interconnection elements extending as spring (probe) elements from substrates (described in greater detail hereinbelow) for testing electronic components; and
  interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is marked contrast to any plated interconnection elements of the prior art wherein plating is used as a protective (e.g., anti-corrosive) coating, and is generally incapable of imparting the desired mechanical characteristic to the interconnection structure.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the PARENT CASE, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1-3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Altering Pitch

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as 0.05-0.10 inches. The interconnection elements 251 . . . 256 are shaped and/or oriented so that their free ends (tips) are at a second, finer pitch, such as 0.005-0.010 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

Use of Sacrificial Substrates

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A-11F fabricating a plurality of interconnection structures (e.g., resilient contact structures) as separate and distinct structures for subsequent mounting to electronic components, and which describes with respect to FIGS. 12A-12C mounting a plurality of interconnection elements to a sacrificial substrate (carrier) then transferring the plurality of interconnection elements en masse to an electronic component.

FIGS. 2D-2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1-10 mil) copper or aluminum foil, or a silicon substrate, by way of example, and the masking material 252 may be common photoresist. The masking layer 252 is patterned to have a plurality (three of many shown) of openings at locations 256a, 256b, 256c whereat it is desired to fabricate interconnection elements. The locations 256a, 256b and 256c are, in this sense, comparable to the terminals of an electronic component. The locations 256a, 256b and 256c are preferably treated at this stage to have a rough or featured surface texture. As shown, this may be accomplished mechanically with an embossing tool 257 forming depressions in the foil 254 at the locations 256a, 256b and 256c. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layers of material. For example, the tip structure 258 may have a thin (e.g., 10-100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

It is within the scope of this invention that a silicon wafer can be used as the sacrificial substrate upon which tip structures are fabricated, and that tip structures so fabricated may be joined (e.g., soldered, brazed) to resilient contact structures which already have been mounted to an electronic component. Further discussion of these techniques are found in FIGS. 8A-8E; hereinbelow.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and may not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

Interposers and Space-Transformers, Generally

The techniques described hereinabove generally set forth a novel technique for fabricating composite interconnection elements, the physical characteristics of which are readily tailored to exhibit a desired degree of resiliency, and which may incorporate tip structures having a surface texture which is well-suited to making pressure connections with terminals of electronic components.

Generally, the composite interconnection elements of the present invention are readily mounted to (or fabricated upon) a substrate which will function as an interposer, disposed between and interconnecting two electronic components, one of the two electronic components disposed on each side of the interposer. The fabrication and use of the composite interconnection elements in interposers is discussed, in detail, in commonly-owned, copending U.S. patent application Ser. No. 08/526,426. The PARENT CASE discloses various techniques for probing semiconductor devices.

The subject of using the interconnection elements of the invention in interposers has been mentioned hereinabove. Generally, as used herein, an "interposer" is a substrate having contacts on two opposite surfaces thereof, disposed between two electronic components to interconnect the two electronic components. Often, it is desirable that the interposer permit at least one of the two interconnected electronic components to be removed (e.g., for replacement, upgrading, implementing engineering changes, and the like).

FIG. 3 illustrates an embodiment of an "generic" interposer 300, such as any one of a number of interposers that have previously been described in various ones of the aforementioned commonly-owned patent applications.

Generally, an insulating substrate 302, such as a PCB-type substrate, is provided with a plurality (two of many shown) of terminals 304 and 306 on a one surface 302 thereof, and a like plurality of terminals 308 and 310 on an opposite surface 302b thereof. Spring contacts 312 and 314 (overcoats omitted, for illustrative clarity) are mounted on the terminals 304 and 306, respectively, and spring contacts 316 and 318 (overcoats omitted, for illustrative clarity) are mounted on the terminals 308 and 310, respectively. These spring contacts are preferably composite interconnection elements of the type disclosed in FIG. 2A, hereinabove, but the spring contacts may be monolithic spring elements.

As noted in commonly-owned, copending U.S. patent application Ser. No. 08/554,902, the interposer may be comprise distinct sets of spring elements on each side thereof (see FIG. 3A in Ser. No. 08/554,902), or may comprise single spring elements supported (such as by solder or elastomer) in holes extending through the support substrate 302 (see FIGS. 3B and 3C in Ser. No. 08/554,902).

The spring elements 312, 314, 316 and 318 of FIG. 3 are suitably formed as composite interconnection elements, as described hereinabove, although an overcoat has been omitted from the figure, for illustrative clarity.

It should clearly be understood that any resilient interconnection element (spring) can be employed, including monolithic spring elements made of materials that are inherently springy, such as phosphor bronze and beryllium copper. This is true of several of the embodiments disclosed herein illustrating composite interconnection elements.

The present invention is also applicable to forming interconnection elements which are formed of soft metal sheets which are patterned (such as by stamping or etching), into flat elongate elements (tabs, ribbons) and overcoated with a hard material. This subject is elaborated upon in commonly-owned, copending U.S. patent application Ser. No. 08/526,246.

"Space transforming" (sometimes referred to as "pitch spreading") is an important concept applicable to the present invention. Simply stated, it is often important that the tips (distal ends) of the resilient contact structures be more closely spaced to one another (relatively fine pitch) than connections to their bases. As illustrated in FIG. 2C, discussed hereinabove, this can be accomplished by shaping and orienting the individual spring elements (251 . . . 256) to converge upon one another, resulting in a tendency for the individual resilient contact structures to have dissimilar lengths. Generally, in the context of a probe card assembly, it is very important for all of the probe elements (resilient contact structures) to have the same length as one another, to ensure constancy in the plurality of signal paths involved.

FIG. 4 illustrates an exemplary design of a space transformer component 400 (spring elements omitted, for illustrative clarity), wherein the desired space-transforming is accomplished by the substrate 402 of the space transformer rather than in the shaping of the individual resilient contact structures (not shown) attached thereto.

The space transformer substrate 402 has a top (as viewed) surface 402a and a bottom (as viewed) surface 402b, and is preferably formed as a multi-layer component having alternating layers of insulating material (e.g., ceramic) and conductive material. In this example, one wiring layer is shown as including two (of many) conductive traces 404a and 404b.

A plurality (two of many shown) of terminals 406a and 406b are disposed on (or recessed within) the top surface 402a of the space transformer substrate 402 at a relatively fine pitch (relatively close to one another). A plurality (two of many shown) of terminals 408a and 408b are disposed on (or recessed in) the bottom surface 402b of the space transformer substrate 402 at a relatively coarse pitch (relative to the terminals 406a and 406b, further apart from one another). For example, the bottom terminals 408a and 408b may be disposed at a 50-100 mil pitch (comparable to printed circuit board pitch constraints), and the top terminals 406a and 406b may be disposed as a 5-10 mil pitch (comparable to the center-to-center spacing of semiconductor die bond pads), resulting in a 10:1 pitch-transformation. The top terminals 406a and 406b are connected to the corresponding bottom terminals 408a and 408b, respectively, by associated conductors 410a/412a and 410b/412b, respectively, connecting the terminals to the conductive traces 404a and 404b, respectively. This is all generally well known, in the context of multi-layer land grid array (LGA) support substrates, and the like.

Probe Card Assembly

The following FIGS. 5, 5A, and 5B are taken directly from commonly-owned, copending U.S. patent application Ser. No. 08/554,902. As will be described in greater detail hereinbelow, the present invention is of great utility in conjunction with the space transformer of Ser. No. 08/554,902, but is not limited to use therewith.

FIG. 5 illustrates an embodiment of a probe card assembly 500 which includes as its major functional components a probe card 502, an interposer 504 and a space transformer 506, and which is suitable in use for making temporary interconnections to a semiconductor wafer 508. In this exploded, cross-sectional view, certain elements of certain components are shown exaggerated, for illustrative clarity. However, the vertical (as shown) alignment of the various components is properly indicated by the dashed lines in the figure. It should be noted that the interconnection elements (514, 516, 524, discussed in greater detail hereinbelow) are shown in full, rather than in section.

The probe card 502 is generally a conventional circuit board substrate having a plurality (two of many shown) of contact areas (terminals) 510 disposed on the top (as viewed) surface thereof. Additional components (not shown) may be mounted to the probe card, such as active and passive electronic components, connectors, and the like. The terminals 510 on the circuit board may typically be arranged at a 100 mil pitch (pitch is defined hereinabove). The probe card 502 is suitably round, having a diameter on the order of 12 inches.

The interposer 504 includes a substrate 512 (compare the substrate 302). In the manner described hereinabove, a plurality (two of many shown) of resilient interconnection elements 514 are mounted (by their proximal ends) to and extend downward (as viewed) from the bottom (as viewed) surface of the substrate 512, and a corresponding plurality (two of many shown) of resilient interconnection elements 516 are mounted (by their proximal ends) to and extend upward (as viewed) from the top (as viewed) surface of the substrate 512. Any of the aforementioned spring shapes are suitable for the resilient interconnection elements 514 and 516, which are preferably the composite interconnection elements of the present invention. As a general proposition, the tips (distal ends) of both the lower plurality 514 and of the upper plurality 516 of interconnection elements 514 and 516 are at a pitch which matches that of the terminals 510 of the probe card 502, for example 100 mils.

The interconnection elements 514 and 516 are illustrated with exaggerated scale, for illustrative clarity. Typically, the interconnection elements 514 and 516 would extend to an overall height of 20-100 mils from respective bottom and top surfaces of the interposer substrate 512. Generally, the height of the interconnection elements is dictated by the amount of compliance desired.

The space transformer 506 includes a suitable circuitized substrate 518 (compare 402, described hereinabove), such as a multi-layer ceramic substrate having a plurality (two of many shown) of terminals (contact areas, pads) 520 disposed on the lower (as viewed) surface thereof and a plurality (two of many shown) of terminals (contact areas, pads) 522 disposed on the upper (as viewed) surface thereof. In this example, the lower plurality of contact pads 520 is disposed at the pitch of the tips of the interconnection elements 516 (e.g., 100 mils), and the upper plurality of contact pads 522 is disposed at a finer (closer) pitch (e.g., 50 mils). These resilient interconnection 514 and 516 elements are preferably, but not necessarily, the composite interconnection elements of the present invention (compare 210, hereinabove).

A plurality (two of many shown) of resilient interconnection elements 524 ("probes", "probe elements") are mounted (by their proximal ends) directly (i.e., without the intermediary of additional materials such as wires connecting the probe elements to the terminals, or brazing or soldering the probe elements to the terminals) to the terminals (contact pads) 522 and extend upward (as viewed) from the top (as viewed) surface of the space transformer substrate 518. As illustrated, these resilient interconnection elements 524 are suitably arranged so that their tips (distal ends) are spaced at an even finer pitch (e.g., 10 mils) than their proximal ends, thereby augmenting the pitch reduction of the space transformer 506. These resilient contact structures (interconnection elements) 524 are preferably, but not necessarily, the composite interconnection elements of the present invention (compare 210, hereinabove).

It is within the scope of the invention that the probe elements (524) can be fabricated on a sacrificial substrate (compare FIGS. 2D-2F) and subsequently individually mounted (compare FIG. 2G) or gang-transferred (compare FIG. 2H) to the terminals (522) of the space transformer component (506).

As is known, a semiconductor wafer 508 includes a plurality of die sites (not shown) formed by photolithography, deposition, diffusion, and the like, on its front (lower, as viewed) surface. Typically, these die sites are fabricated to be identical to one another. However, as is known, flaws in either the wafer itself or in any of the processes to which the wafer is subjected to form the die sites, can result in certain die sites being non-functional, according to well established test criteria. Often, due to the difficulties attendant probing die sites prior to singulating semiconductor dies from a semiconductor wafer, testing is performed after singulating and packaging the semiconductor dies. When a flaw is discovered after packaging the semiconductor die, the net loss is exacerbated by the costs attendant to packaging the die. Semiconductor wafers typically have a diameter of at least 6 inches, including at least 8 inches.

Each die site typically has a number of contact areas (e.g., bond pads), which may be disposed at any location and in any pattern on the surface of the die site. Two (of many) bond pads 526 of a one of the die sites are illustrated in the figure.

A limited number of techniques are known for testing the die sites, prior to singulating the die sites into individual semiconductor dies. A representative prior art technique involves fabricating a probe card insert having a plurality of tungsten "needles" embedded in and extending from a ceramic substrate, each needle making a temporary connection to a given one of the bond pads. Such probe card inserts are expensive and somewhat complex to manufacture, resulting in their relatively high cost and in a significant lead time to obtain. Given the wide variety of bond pad arrangements that are possible in semiconductor dies, each unique arrangement requires a distinct probe card insert.

The rapidity with which unique semiconductor dies are manufactured highlights the urgent need for probe card inserts that are simple and inexpensive to manufacture, with a short turnaround time. The use of an interposer (504), and a space transformer (506) as a probe card insert, squarely addresses this compelling need.

In use, the interposer 504 is disposed on the top (as viewed) surface of the probe card 502, and the space transformer 506 is stacked atop (as viewed) the interposer 504 so that the interconnection elements 514 make a reliable pressure contact with the contact terminals 510 of the probe card 502, and so that the interconnection elements 516 make a reliable pressure contact with the contact pads 520 of the space transformer 506. Any suitable mechanism for stacking these components and for ensuring such reliable pressure contacts may be employed, a suitable one of which is described hereinbelow.

The probe card assembly 500 includes the following major components for stacking the interposer 506 and the space transformer 506 onto the probe card 502:

a rear mounting plate 530 made of a rigid material such as stainless steel, an actuator mounting plate 532 made of a rigid material such as stainless steel, a front mounting plate 534 made of a rigid material such as stainless steel, a plurality (two of many shown, three is preferred) of differential screws including an outer differential screw element 536 and an inner differential screw element 538, a mounting ring 540 which is preferably made of a springy material such as phosphor bronze and which has a pattern of springy tabs (not shown) extending therefrom, a plurality (two of many shown) of screws 542 for holding the mounting ring 538 to the front mounting plate 534 with the space transformer 506 captured therebetween, optionally, a spacer ring 544 disposed between the mounting ring 540 and the space transformer 506 to accommodate manufacturing tolerances, and a plurality (two of many shown) of pivot spheres 546 disposed atop (as viewed) the differential screws (e.g., atop the inner differential screw element 538).

The rear mounting plate 530 is a metal plate or ring (shown as a ring) disposed on the bottom (as shown) surface of the probe card 502. A plurality (one of many shown) of holes 548 extend through the rear mounting plate.

The actuator mounting plate 532 is a metal plate or ring (shown as a ring) disposed on the bottom (as shown) surface of the rear mounting plate 530. A plurality (one of many shown) of holes 550 extend through the actuator mounting plate. In use, the actuator mounting plate 532 is affixed to the rear mounting plate 530 in any suitable manner, such as with screws (omitted from the figure for illustrative clarity).

The front mounting plate 534 is a rigid, preferably metal ring. In use, the front mounting plate 534 is affixed to the rear mounting plate 530 in any suitable manner, such as with screws (omitted from the figure for illustrative clarity) extending through corresponding holes (omitted from the figure for illustrative clarity) through the probe card 502, thereby capturing the probe card 502 securely between the front mounting plate 534 and rear mounting plate 530.

The front mounting plate 534 has a flat bottom (as viewed) surface disposed against the top (as viewed) surface of the probe card 502. The front mounting plate 534 has a large central opening therethrough, defined by an inner edge 552 the thereof, which is sized to permit the plurality of contact terminals 510 of the probe card 502 to reside within the central opening of the front mounting plate 534, as shown.

As mentioned, the front mounting plate 534 is a ring-like structure having a flat bottom (as viewed) surface. The top (as viewed) surface of the front mounting plate 534 is stepped, the front mounting plate being thicker (vertical extent, as viewed) in an outer region thereof than in an inner region thereof. The step, or shoulder is located at the position of the dashed line (labelled 554), and is sized to permit the space transformer 506 to clear the outer region of the front mounting plate and rest upon the inner region of the front mounting plate 534 (although, as will be seen, the space transformer actually rests upon the pivot spheres 546).

A plurality (one of many shown) of holes 554 extend into the outer region of the front mounting plate 534 from the top (as viewed) surface thereof at least partially through the front mounting plate 534 (these holes are shown extending only partially through the front mounting plate 534 in the figure) which, as will be seen, receive the ends of a corresponding plurality of the screws 542. To this end, the holes 554 are threaded holes. This permits the space transformer 506 to be secured to the front mounting plate by the mounting ring 540, hence urged against the probe card 502.

A plurality (one of many shown) of holes 558 extend completely through the thinner, inner region of the front mounting plate 534, and are aligned with a plurality (one of many shown) of corresponding holes 560 extending through the probe card 502 which, in turn, are aligned with the holes 548 in the rear mounting plate and the holes 550 in the actuator mounting plate 538.

The pivot spheres 546 are loosely disposed within the aligned holes 558 and 560, at the top (as viewed) end of the inner differential screw elements 538. The outer differential screw elements 536 thread into the (threaded) holes 550 of the actuator mounting plate 532, and the inner differential screw elements 538 thread into a threaded bore of the outer differential screw elements 536. In this manner, very fine adjustments can be made in the positions of the individual pivot spheres 546. For example, the outer differential screw elements 536 have an external thread of 72 threads-per-inch, and the inner differential screw elements 538 have an external thread of 80 threads-per inch. By advancing an outer differential screw element 536 one turn into the actuator mounting plate 532 and by holding the corresponding inner differential screw element 538 stationary (with respect to the actuator mounting plate 532), the net change in the position of the corresponding pivot sphere 546 will be 'plus' 1/72 (0.0139) 'minus' 1/80 (0.0125) inches, or 0.0014 inches. This permits facile and precise adjustment of the planarity of the space transformer 506 vis-a-vis the probe card 502. Hence, the positions of the tips (top ends, as viewed) of the probes (interconnection elements) 524 can be changed, without changing the orientation of the probe card 502. This feature, a technique for performing alignment of the tips of the probes, and alternate mechanisms (means) for adjusting the planarity of the space transformer are discussed in greater detail in commonly-owned, copending U.S. patent application Ser. No. 08/554,902. Evidently, the interposer 504 ensures that electrical connections are maintained between the space transformer 506 and the probe card 502 throughout the space transformer's range of adjustment, by virtue of the resilient or compliant contact structures disposed on the two surfaces of the interposer.

The probe card assembly 500 is simply assembled by placing the interposer 504 within the opening 552 of the front mounting plate 534 so that the tips of the interconnection elements 514 contact the contact terminals 510 of the probe card 502, placing the space transformer 506 on top of the interposer 504 so that the tips of the interconnection elements 516 contact the contact pads 520 of the space transformer 506, optionally placing a spacer 544 atop the space transformer 506, placing the mounting ring 540 over the spacer 544, and inserting the screws 542 through the mounting ring 540 through the spacer 544 and into the holes 554 of the front mounting plate 534, and mounting this "subassembly" to the probe card 502 by inserting screws (one shown partially as 555) through the rear mounting plate 530 and through the probe card 502 into threaded holes (not shown) in the bottom (as viewed) surface of the front mounting plate 534. The actuator mounting plate 538 can then be assembled (e.g., with screws, on of which is shown partially as 556) to the rear mounting plate 530, pivot spheres 560 dropped into the holes 550 of the actuator mounting plate 532, and the differential screw elements 536 and 538 inserted into the holes 550 of the actuator mounting plate 532.

In this manner, a probe card assembly is provided having a plurality of resilient contact structures (524) extending therefrom for making contact with a plurality of bond pads (contact areas) on semiconductor dies, prior to their singulation from a semiconductor wafer, at a fine pitch which is commensurate with today's bond pad spacing. Generally, in use, the assembly 500 would be employed upside down from what is shown in the figure, with the semiconductor wafer being pushed (by external mechanisms, not shown) up onto the tips of the resilient contact structures (524).

As is evident from the figure, the front mounting plate (baseplate) 534 determined the position of the interposer 504 vis-a-vis the probe card 502. To ensure accurate positioning of the front mounting plate 534 vis-a-vis the probe card 502, a plurality of alignment features (omitted from the figure for illustrative clarity) such as pins extending from the front mounting plate) and holes extending into the probe card 502 may be provided.

It is within the scope of this invention that any suitable resilient contact structures (514, 516, 524) be employed on the interposer (504) and/or the space transformer (506), including tabs (ribbons) of phosphor bronze material or the like brazed or soldered to contact areas on the respective interposer or space transformer.

It is within the scope of this invention that the interposer (504) and the space transformer (506) can be pre-assembled with one another, such as with spring clips, described as element 486 of FIG. 29 of the aforementioned copending, commonly-owned PCT/US94/13373, extending from the interposer substrate.

It is within the scope of this invention that the interposer (504) be omitted, and in its stead, a plurality of resilient contact structures comparable to 514 be mounted directly to the contact pads (520) on the lower surface of the space transformer. However, achieving coplanarity between the probe card and the space transformer would be difficult. A principal function of the interposer is to provide compliance to ensure such coplanarity.

The Space-Transformer Substrate

As mentioned hereinabove, the present invention is very beneficial when used in conjunction with a space transformer that is a component of a probe assembly.

Whereas the space transformer 506 of the probe assembly described in commonly-owned, copending U.S. patent application Ser. No. 08/554,902 preferably was constructed with spring (probe) elements mounted to (fabricated directly upon) its top surface, the present invention avoids problems associated with mounting spring elements to the top surface of the space transformer component, and extends the range of utility of the entire probe assembly.

FIG. 5A illustrates, in perspective view, a suitable space transformer substrate 518 for the probe card assembly 500 of FIG. 5. As shown therein, the space transformer substrate 518 is suitably a rectangular solid, having a length "L" a width "W" and a thickness "T". In this figure, the top surface 518a of the space transformer substrate 518 is visible, to which the probing interconnection elements (compare 524) are mounted. As shown, a plurality (such as several hundred) of contact pads 522 are disposed on the top surface 518a of the space transformer substrate 518 in a given area thereof. The given area is indicated by the dashed lines labelled 570 and, as is evident, the contact pads 522 may be arranged in any suitable pattern within the given area 570.

As mentioned hereinabove, the space transformer substrate 518 is suitably formed as a multi-layer ceramic substrate, having alternating layers of ceramic and patterned conductive material.

The fabrication of such multi-layer ceramic substrates is well known and is employed, for example, in the manufacture of Land Grid Array (LGA) semiconductor packages. By appropriately routing the patterned conductive material within such a multi-layer substrate, it is simple and straightforward to dispose contact pads (not visible in this view, compare 520) on the bottom surface (not visible in this view) of the substrate 518 at a pitch which is different than (e.g., larger than) the pitch of the contact pads 522 on the top surface 518a of the substrate 518, and to connect the contact pads 520 with the contact pads 522 to one another internally within the substrate 516. Achieving a pitch of approximately 10 mils between the contact pads 522 on such a substrate is very feasible.

FIG. 5A illustrates a preferred feature of the space transformer substrate 518. As mentioned, the substrate 518 is a rectangular solid having a top surface 518a, a bottom surface (hidden from view in this figure), and four side edges 518b, 518c, 518d and 518e. As is shown, notches 572b, 572c, 572d and 572e are provided along the intersections of the respective side edges 518b, 518c, 518d and 518e and the top surface 518a of the substrate 518 along nearly the entire length (exclusive of the corners) of the respective side edges 518b . . . 518e. These notches 572b . . . 572e generally facilitate the manufacture of the space transformer substrate 518 as a multi-layer ceramic structure, and are also visible in the illustration of FIG. 5. It should be understood that the notches are not a necessity. Evidently, since the four corners of the substrate 518 are not notched (which is basically dictated by the process of making a ceramic, multilayer substrate), the mounting plate (540 of FIG. 5) must evidently accommodate these corner "features".

FIG. 5B illustrates an embodiment of a space transformer substrate 574 which is comparable to the space transformer substrate 518 of the previous illustration, and which can similarly be employed in the probe card assembly 500 of FIG. 5. In this case, a plurality (four of many shown) of areas 570a, 570b, 570c and 570d are defined, within each of which a plurality of contact pads 522a, 522b, 522c can readily be disposed in any desired pattern. It is generally intended that the spacing of the areas 570a . . . 570d correspond to the spacing of die sites on a semiconductor wafer so that a plurality of die sites can simultaneously be probed with a single "pass" of the probe card. (This is especially useful for probing multiple memory chips resident on a semiconductor wafer.) Typically, the pattern of the contact pads 522a . . . 522d within the respective areas 570a . . . 570d of the substrate 574 will be identical to one another, although this is not absolutely necessary.

In the context of the probe assembly of commonly-owned, copending U.S. patent application Ser. No. 08/554, 902, it was discussed that illustration of FIG. 5B clearly demonstrates that a single space transformer can be provided with probe elements for probing (making pressure contacts with) a plurality (e.g., four, as illustrated) of adjacent die sites on a semiconductor wafer. This is beneficial in reducing the number of setdowns (steps) required to probe many or all of the die sites on a wafer. For example, if there are one hundred die sites on a wafer, and four sets of probe elements on the space transformer, the wafer need only be positioned against the space transformer twenty-five times (ignoring, for purposes of this example, that efficiency at the edge (periphery) of the wafer would be somewhat attenuated). It is within the scope of this invention that the arrangement of probe sites (e.g., 570a . . . 570d), as well as the orientation of the individual probe elements (e.g., staggered) can be optimized to minimize the number of touchdowns (passes) required to probe an entire wafer. It is also within the scope of this invention that the probe elements can be arranged on the surface of the space transformer in a manner that alternate probe elements make contact with different ones of two adjacent die sites on the wafer. Given that it is generally desirable that the probe elements all have the same overall length, it is evident that the unconstrained manner in which the probe elements can be attached (mounted) directly to any point on the two-dimensional surface of the space transformer is superior to any technique which constrains the location whereat the probe elements are attached to a probe card (e.g., ring arrangements, as described hereinabove). It is also within the scope of this invention that a plurality of non-adjacent die sites on a wafer could be probed in this manner. The present invention is particularly beneficial to probing unsingulated memory devices on a wafer, and is useful for probing die sites having any aspect ratio.

The space transformer substrate 574 is an example of a "larger substrate" than can be populated by smaller tile substrates having spring contacts or probe elements or the like disposed on a surface thereof, as is discussed in greater detail hereinbelow.

The illustrations and descriptions of FIGS. 5C, 6A, 6B, 7, 7A, 8A and 8B, from commonly-owned, copending U.S. patent application Ser. No. 08/554,902 are omitted from this application as being non-essential, but are incorporated by reference herein.

Tiles, and Tiling (Populating) the Space Transformer Substrate

As discussed hereinabove, spring contacts which are probe elements (e.g., 524, 526) can be mounted directly to the surface of the space transformer substrate (e.g., 506, 518, 574) of a probe card assembly (e.g., 500). This approach, however, has certain inherent limitations. The space transformer can typically include a relatively expensive substrate upon which to fabricate spring (probe) elements. Yield (successful fabrication) problems may be experienced in the process of fabricating composite interconnection elements on the surface thereof resulting, at best, in difficult (i.e., time-consuming and expensive) re-working of the space transformer component. Additionally, it is a costly proposition to design different space transformers for each and every testing application (i.e., layout of bond pads/terminals on the electronic component being contacted/tested). Moreover, it would be desirable to have the ability to test an entire semiconductor wafer in a single pass, which would require a commensurately large space transformer with the aforementioned limitations of design and exacerbated problems of yield.

According to an aspect of the present invention, probe elements are fabricated on relatively inexpensive substrates, termed "tiles" herein. These tiles are readily attached (mounted, joined) to the surface of a space transformer and electrically-connected to the terminals thereof, such as by soldering or with a z-axis conductive adhesive. A plurality of such tiles can be attached and connected to a single space transformer component to effect wafer-level testing. The tiles can be single layer substrates or can be multilayer substrates (compare FIG. 4) effecting a degree of space-transformation. The z-axis spacing between the tile(s) and the surface of the space transformer is readily controlled by the volume of solder, z-axis adhesive, or the like used to make the attachment(s)/connection(s).

A plurality of tiles having spring contact elements fabricated on a surface thereof can be fabricated from a single, inexpensive substrate such as a ceramic wafer, which is subsequently diced to result in a plurality of separate, preferably identical tiles which can be individually mounted to the surface of a space transformer or (as discussed hereinbelow) to the surface of a semiconductor wafer, or other electronic component).

For wafer-level testing (including burn-in), a plurality of such tiles upon which spring (probe) elements have been fabricated can be attached/connected to a single, large space transformer component, to effect wafer-level probing (testing) of an entire semiconductor wafer in a single pass.

It is within the scope of this invention that a tile substrate (e.g., 600, described hereinbelow) can readily be soldered to an existing substrate such as a "C4" package (sans semiconductor die). Such "C4" packages are readily available.

An advantage to the technique of using tiles, rather than fabricating spring contact elements directly upon the surface of the space transformer, is that the space transformer is readily re-worked, simply by replacing selected ones of the one or more tiles attached/connected thereto.

FIG. 6 illustrates an embodiment of a tile 600 having a substrate 602 formed of an insulating material such as ceramic, terminals (two of many shown) 604 and 606 disposed on (or within) a top (as viewed) surface 602*a* thereof, and terminals (two of many shown) 608 and 610 disposed on an opposite, bottom surface 602*b* thereof. The tile substrate 602 is similar to the interposer substrate 302 of FIG. 3 or to the space transformer substrate 402 of FIG. 4. Selected ones of the terminals 604 and 606 are electrically-connected to corresponding selected ones of the terminals 608 and 610, respectively, in any suitable manner, such as with conductive vias (not shown) extending through the substrate 602. (Vias through and internal wiring within a substrate are well known and are shown, for example, in FIG. 4.)

A plurality (two of many shown) of spring elements 612 and 614 are mounted to the terminals 604 and 606, respectively, and may be composite interconnection elements such as have been described hereinabove, or monolithic spring elements such as have been described hereinabove.

As used herein, the term "spring contact carrier" means a tile substrate (e.g., 602) having spring contacts (e.g., 612, 614) mounted to one surface thereof.

In FIG. 6, the spring elements 612 and 614 are illustrated to have the same configuration as the probe elements 524 shown in FIG. 5. This is merely illustrative, and it should be understood that any spring elements having any configuration (shape) can be affixed to the surface 602*a* of the tile substrate 602.

As mentioned hereinabove, such a tile substrate having spring elements affixed thereto is readily mounted and connected to a space transformer component (e.g., 506) of a probe card assembly (e.g., 500). As illustrated, solder bumps 616 and 618 are readily formed on the terminals 608 and 610, respectively, so that the tile 600 can be connected to corresponding pads (terminals) of a space transformer component by reflow heating, forming solder joints between the terminals of the tile component and the terminals of the space transformer component. Alternatively, a z-axis conductive adhesive (not shown) can be used, in lieu of solder, to effect electrical connections between the terminals of the tile component and the terminals of the space transformer component.

FIG. 6A illustrates the manner in which a plurality (one of many shown) of tiles 620 (comparable to the tile 600 of FIG. 6) can be mounted to the surface of a space transformer component 622 (comparable to the space transformer component substrate 574 illustrated in FIG. 5B).

The top (visible) surface of the space transformer component has a plurality (four of many shown) of areas 624*a*, 624*b*, 624*c* and 624*d* (comparable to 570*a*, 570*b*, 570*c* and 570*d*), within each of which a plurality of contact pads (not shown, compare 522*a*, 522*b*, 522*c*, 522*d*) are disposed in any desired pattern.

In FIG. 6A, the solder bumps (e.g.) on the surface of the tile substrate opposite the spring elements are omitted, for illustrative clarity. When reflow heated to solder the tile substrate to the space transformer substrate, the tiles 620 will tend to self-align to the areas 624*a* . . . 624*d* of the space transformer 622. However, small solder features (such as C4 bumps) may not always a sufficient amount of surface tension force to effect such self-alignment.

According to an aspect of the invention, in order to enhance self-alignment of each tile 620 to each area 624*a* . . . 624*d*), the top (visible in the figure) surface of the space transformer substrate 622 is provided with at least one solderable feature 626 and the mating bottom (visible in the figure) surface of the tile substrate 620 is provided with corresponding at least one solderable feature 628. During reflow heating, solder disposed upon and wetting these two corresponding mating features 626 and 628 will provide enhanced momentum for effecting self-alignment of the tile substrate to the space transformer substrate. The solder may be applied to either one of the mating features prior to reflow heating.

FIG. 6A illustrates a significant feature of the present invention—namely, that a plurality of tiles can be mounted to a single space transformer component of a probe card assembly to effect multi-head testing of multiple die sites on a semiconductor wafer in a single pass (touchdown), including wafer-scale testing. A space transformer substrate having a plurality of tiles attached thereto functions readily as a multiple device test head.

It is within the scope of this invention that the spring elements may extend beyond the periphery of the tile substrate, both in this embodiment and in the embodiment of tiling semiconductor wafers described hereinbelow.

Further discussion of maintain proper alignment between a plurality of tiles and a larger component is found hereinbelow with respect to FIGS. 9A-9D.

It is important to appreciate that the volume of solder for each solder connection (including the alignment features 626/628) should carefully be controlled to establish a precise standoff (gap) between the back surface of the tile substrates and the front surface of the larger substrate. Any deviations in solder volume may promulgate to unacceptable height (z-axis) variations. Height uniformity being desired, any suitably precise means of controlling the solder volume may be employed, including using precisely-formed solder preforms, systems for delivering precise dollops of solder paste, solder balls of precise volume, and the like.

Tiles, and Tiling a Semiconductor Wafer, for Test/Burn-In

In certain instances, it may not be desirable to fabricate spring elements directly on the surface of certain semiconductor devices. For example, fabricating the composite interconnection elements of the present invention on fully-populated "C4" dies (semiconductor devices) having active devices may damage the device, or prevent access to certain features of the device.

According to this aspect of the invention, tiles may be mounted directly to semiconductor devices, including fully-populated C4 dies with active devices, either prior to or after their singulation from a semiconductor wafer. In this manner, spring contact elements are readily mounted to semiconductor devices, while avoiding fabricating the spring contact elements directly upon the semiconductor devices.

According to a feature of this aspect of the invention, semiconductor devices which have had spring contact elements mounted thereto in the aforementioned manner are readily tested and/or burned-in using a simple test fixture which may be as simple as a printed circuit board (PCB) having terminals (pads) arranged to mate (by pressure contact) with the tips of the spring contact elements.

Generally, the advantages of mounting tiles to semiconductor devices, especially prior to their being singulated from the semiconductor wafer, are similar to the advantages accruing to the aforementioned tiling of a space transformer substrate—namely, it is not necessary to yield the entire wafer, re-work is greatly facilitated, and any (i.e., composite or monolithic) spring elements can readily be mounted and connected to the semiconductor devices.

This technique of mounting tiles to semiconductor devices is superior, in certain instances, to the technique of wire-bonding substrates upon which spring elements have been fabricated to semiconductor devices, such as is disclosed in commonly-owned U.S. patent application Ser. No. 08/-tbd-, filed Feb. 15, 1996.

FIG. 7 illustrates a technique 700 wherein a plurality (three of many shown) of tile substrates 702 populate a surface of a larger substrate 706 which may (or many not) be a silicon wafer having a plurality of die sites 704. The larger substrate 706 is, for example, a space transformer component of a probe card assembly.

Each tile substrate 702 has a plurality (two of many shown) of free-standing interconnection elements 710 extending from the top (as viewed) surface thereof. These interconnection elements 710 may be monolithic interconnection elements or composite interconnection elements, and may or may not have tip structures affixed to their free ends. The interconnection elements 710 are preferably spring elements, and are suitably probe elements. Each tile substrate 702 is mounted by means of solder connections 708 to corresponding terminals (not shown) on the top (as viewed) surface of the larger substrate 706. The solder connections 708 may be "C4" solder connections.

In this manner, a larger substrate (706) is populated with a plurality of spring contact carriers (i.e., tile substrates 702). Among the numerous advantages of this technique (700) are that any problems with yielding (successfully manufacturing) the interconnection elements affects only the smaller tile substrates (702), and not the larger substrate (706).

Gang-Transferring the Spring Elements to the Tile Substrate

In the main, hereinabove, techniques have been described for fabricating composite interconnection (resilient contact) structures by bonding an end of wire to a terminal of an electronic component, configuring the wire to be a wire stem having a springable shape, overcoating the wire with a resilient (high yield strength) material. In this manner, resilient contact structures may be fabricated directly upon terminals of an electronic component, such as the tile of the present invention.

According to the invention, a plurality of spring elements are pre-fabricated, without mounting the spring elements (resilient contact structures) to the electronic component, for subsequent (after the resilient contact structures are fabricated) mounting (such as by brazing) to the electronic component.

According to one technique, a supply (e.g., "bucket") of spring elements can be fabricated and warehoused, for later attachment (mounting), such as by brazing, to the terminals of electronic components. Compare FIG. 2G. According to another technique, a plurality of spring elements can be pre-fabricated upon a sacrificial substrate, then gang-transferred to the terminals of the electronic component (e.g., tile). These two techniques are discussed in the PARENT CASE (see, e.g., FIGS. 11A-11F and 12A-12E, therein).

FIGS. 8A and 8B illustrate the technique 800 of gang-transferring a plurality of pre-fabricated contact structures 802 to the terminals of an electronic component 806, (such as the tile component 600 of FIG. 6. In this illustration, the tile component effects some space transformation, but this is not required.

As illustrated in FIG. 8A, the plurality of spring elements 802, for example of the type illustrated in FIG. 1E, are fabricated upon tip structures 808 which have been formed in a sacrificial substrate 810, according to the techniques described hereinabove, or in any of the aforementioned commonly-owned, copending patent applications.

As illustrated in FIG. 8B, the spring elements 802 may be mounted en masse (gang-transferred), such as by soldering 812, to the terminals 804 of the electronic component 806, after which the sacrificial substrate 810 can readily be removed (such as by selective wet etching). Solder balls 814 are readily attached to the terminals on the opposite surface of the tile substrate. The tile substrate of FIG. 8B is comparable to the tile substrate of FIG. 6, in that both have solder balls on one surface and spring elements on the opposite surface.

The benefits of having textured tips for the spring elements, to effect more reliable pressure connections to terminals of other electronic components, has been described in detail in several of the aforementioned commonly-owned patent applications. FIG. 8B is illustrative on one of many ways in which a tile substrate can be provided with spring elements having (if desired) textured tips.

Planarization, and Mounting Tips to the Spring Elements

The benefits of the distal ends (tips) of the spring elements being coplanar, and the ease with which this is accomplished, has been described in detail in several of the aforementioned commonly-owned patent applications.

FIGS. 8C-8G illustrate exemplary techniques for forming tip structures on a sacrificial substrate, and transferring the pre-fabricated tip structures to tips of interconnection elements mounted to a tile substrate.

FIG. 8C illustrates a technique 820 for fabricating tip structures on a sacrificial substrate, for subsequent attaching to tips of interconnection elements extending from a surface of an electronic component (e.g., a tile substrate), and is particularly useful for, but not limited to, the aforementioned composite interconnection elements. In this example, a silicon substrate (wafer) 822 having a top (as viewed) surface is used as the sacrificial substrate. A layer 824 of titanium is deposited (e.g., by sputtering) onto the top surface of the silicon substrate 822, and has a thickness of approximately 250 Å (1 Å=0.1 nm=$10^{-10}$ m). A layer 826 of aluminum is deposited (e.g., by sputtering) atop the titanium layer 824, and has a thickness of approximately 10,000 Å. The titanium layer 824 is optional and serves as an adhesion layer for the aluminum layer 826. A layer 828 of copper is deposited (e.g., by sputtering) atop the aluminum layer 826, and has a thickness of approximately 5,000 Å. A layer 830 of masking material (e.g., photoresist) is deposited atop the copper layer 828, and has a thickness of approximately 2 mils. The masking layer 830 is processed in any suitable manner to have a plurality (three of many shown) of holes 832 extending through the photoresist layer 830 to the underlying copper layer 828. For example, each hole 822 may be 6 mils in diameter, and the holes 832 may be arranged at a pitch (center-to-center) of 10 mils. The sacrificial substrate 822 has, in this manner, been prepared for fabricating a plurality of multi-layer contact tips within the holes 832, as follows:

A layer 834 of nickel is deposited, such as by plating, onto the copper layer 828, and has a thickness of approximately 1.0-1.5 mils. Optionally, a thin layer (not shown) of a noble metal such as rhodium can be deposited onto the copper layer prior to depositing the nickel. Next, a layer 836 of gold is deposited, such as by plating, onto the nickel 834. The multi-layer structure of nickel and aluminum (and, optionally, rhodium) will serve as a fabricated tip structure (840, as shown in FIG. 8D).

Next, as illustrated in FIG. 8D, the photoresist 830 is stripped away (using any suitable solvent), leaving a plurality of fabricated tip structures 840 sitting atop the copper layer 828. Next, the copper (828) is subjected to a quick etch process, thereby exposing the aluminum layer 826. As will be evident, aluminum is useful in subsequent steps since it is substantially non-wettable with respect to solder and braze materials.

It bears mention that it is preferred to pattern the photoresist with additional holes within which "ersatz" tip structures 842 may be fabricated in the same process steps employed to fabricate the tip structures 840. These ersatz tip structures 842 will serve to uniformize the aforementioned plating steps in a manner that is well known and understood, by reducing abrupt gradients (non-uniformities) from manifesting themselves across the surface being plated. Such structures (842) are known in the field of plating as "robbers".

Next, solder or brazing paste ("joining material") 844 is deposited onto the top (as viewed) surfaces of the tip structures 840. (There is no need to deposit the paste onto the tops of the ersatz tip structures 842). This is implemented in any suitable manner, such as with a stainless steel screen or stencil. A typical paste (joining material) 844 would contain gold-tin alloy (in a flux matrix) exhibiting, for example, 1 mil spheres (balls).

The tip structures 840 are now ready to be mounted (e.g., brazed) to ends (tips) of interconnection elements, for example the composite interconnect elements of the present invention. However, it is preferred that the interconnection elements first be specially "prepared" to receive the tip structures 840.

FIG. 8E illustrates a technique 850 for preparing a tile substrate 852 (compare 602) with a plurality (two of many shown) of interconnection elements 854 (compare 612, 614) in anticipation of pre-fabricated tip structures (840) being mounted to the ends of the interconnection elements 854. The interconnections elements (spring contacts) 854 are shown in full (rather than in cross section).

In this example, the interconnection elements 854 are multilayer composite interconnection elements (compare FIG. 2A) and have a gold (wire) core overcoated with a layer (not shown) of copper and further overcoated with a layer (not shown) of nickel (preferably a nickel-cobalt alloy having proportions 90:10 of Ni:Co), and further overcoated with a layer (not shown) of copper. It is preferred that the nickel layer be deposited to only a substantial portion (e.g., 80%) of its desired final thickness, the remaining small portion (e.g., 20%) of the nickel thickness being deposited in a subsequent step, described hereinbelow.

In this example, the tile substrate 852 is provided with a plurality (two of many shown) of pillar-like structures 856 extending from its top (as viewed) surface which, as will be evident, will function as polishing "stops". It is not necessary to have a large number of these polishing stops, and they are readily formed with and of the same material as the substrate (e.g., ceramic), and may be removed after polishing (discussed hereinbelow).

The tile substrate 854 is then "cast" with a suitable casting material 858, such as thermally-meltable, solution-soluble polymer, which serves to support the interconnection elements 854 extending from the top surface of the tile substrate 852. The top (as viewed) surface of the overmolded substrate is then subjected to polishing, such as with a polishing wheel 860 which is urged down (as viewed) onto the top surface of the casting material. The aforementioned polishing stops 858 determine the final position of the polishing wheel, as indicated by the dashed line labelled "P". In this manner, the tips (top ends, as viewed) of the interconnection elements 854 are polished to be substantially perfectly coplanar with one another.

As discussed hereinabove, a mechanism (e.g., differential screws or an automated mechanism) is provided in the overall probe card assembly (500) to orient the space transformer substrate to ensure that the tips of resilient contact structures extending from the tile substrate mounted thereto will be coplanar with a semiconductor wafer being tested, and that the tips of the spring (probe) elements are planarized to make substantially simultaneous contact with the wafer. Certainly, starting with tips which have been planarized by polishing (or by any other suitable means) will contribute to achieving this important objective. Moreover, by ensuring that the tips of the probe elements (854) are coplanar to begin with, relaxes (reduces) the constraints imposed on the interposer component (534) to accommodate (by compliance) non-planarities in the tips of the probe elements (854.) extending from the tile component.

After having planarized the tips of the interconnection (e.g., probe) elements 854 by polishing, the casting material 858 is removed with a suitable solvent. (The polishing stops 856 will be removed at this time.) Casting materials are well known, as are their solvents. It is within the scope of this invention that casting materials such as wax, which can simply be melted away, can be used to support the probe elements (854) for polishing. The spring elements (854) of the tile (852) have, in this manner, been prepared to receive the aforementioned tip structures (840).

A beneficial side effect of the polishing operation is that the material overcoating the gold wire stem (core) of an interconnection element 854 which is a composite interconnection element will be removed at the tip, leaving the gold core exposed. Inasmuch as it is desired to braze tip structures (840) to the tips of the composite interconnection elements, having exposed gold material to braze to is desireable.

It is preferred to further "prepare" the tile substrate 852 for receiving the tip structures 840 by first performing one additional plating step—namely, nickel plating the composite interconnection elements 854 to provide the composite interconnection elements with the aforementioned remaining small portion (e.g., 20%) of their desired, overall nickel thickness. If desired, the previously-mentioned exposed gold tip (see previous paragraph) can be masked during this additional plating step.

The sacrificial substrate 822 having tip structures 840 is brought to bear upon the prepared tile substrate 852. As shown in FIG. 8F, the tip structures 840 (only two tip structures are shown in the view of FIG. 8F, for illustrative clarity) are aligned with the tips of the free-standing interconnection elements 854, using standard flip-chip techniques (e.g., split prism), and the assembly is passed through a brazing furnace to reflow the joining material 844, thereby joining (e.g., brazing) the prefabricated tip structures 840 to the ends of the contact structures 854.

It is within the scope of this invention that this technique can be used to join (e.g., braze) pre-fabricated tip structures to ends of non-resilient contact structures, resilient contact structures, composite interconnection elements, monolithic interconnection elements, and the like.

In a final step, the sacrificial substrate 822 is removed in any suitable manner, resulting in a tile substrate 852 having a plurality of free-standing interconnection elements 854, each with prefabricated tip structures 840, as illustrated in FIG. 8G. (Note that the joining material 844 has reflowed as "fillets" on end portions of the interconnection elements 854.).

It is within the scope of the invention that the brazing (soldering) paste 844 is omitted, and in its stead, a layer of eutectic material (e.g., gold-tin) is plated onto the resilient contact structures prior to mounting the contact tips (840) thereto.

Alignment of Tiles on Large Substrates

As discussed hereinabove, relatively large substrate (e.g., 622), such as the space transformer substrate of a probe card assembly, can be provided with a plurality of relatively small tiles having spring contacts on a surface thereof (e.g., 620), in order to facilitate making pressure connections to another electronic component having a relatively large surface area, such as an entire semiconductor wafer, thereby permitting processes such as Wafer-Level Burn-In (WLBI) to be performed.

In the process of mounting a plurality of tiles, each having a plurality of free-standing spring elements to a larger substrate, proper alignment must be maintained by:

(1) in the z-axis, maintaining a prescribed height (typically coplanar) for the tips (distal, free ends) of the spring elements; and (2) in the x and y axes, maintaining a prescribed spacing between the tips of the spring elements.

Generally, the process of fabricating a plurality of free-standing spring elements on tile substrates is highly determinate in that the height (z-axis) and spacing (x and y axes) of the plurality of spring elements on individual tiles can be checked (inspected), prior to mounting the tiles to a larger substrate. Tiles having spring elements with faulty height or spacing can either be reworked or discarded.

As discussed with respect to FIG. 6A, hereinabove, a plurality of tiles (e.g., 620) can be mounted to larger substrates (e.g., 622) by reflow soldering. Large, carefully placed (e.g., lithographically) solder features (e.g., 628, 626) can substantially control the x-y alignment of the tile with respect to the substrate. And by carefully controlling the amount of solder used, it is possible to exercise substantial control over the space between the back (e.g., 602b) of the tile and the front surface of the larger substrate (e.g., 622). And, as mentioned above, this reasonably presumes that the tips of the free-standing spring elements are determinate with respect to the back surface of the tile substrate.

FIG. 9A illustrates an alternate technique 900 for maintaining a plurality (three of many shown) of tile substrates 902 (compare 620) in proper alignment with a larger substrate 904. In this case, the front (top, as viewed) surface of the larger substrate 904 is provided with a plurality (three of many shown) of recesses (wells) 906 which are sized to receive the individual tiles 902 and maintain them in a prescribed x-y alignment with one another. As in the example of FIG. 6A, careful control of solder volume can assure repeatable z-axis (vertical in the figure) spacing between the back surfaces of the tiles and the front surface of the substrate 904. This technique is generally not preferred, since it adds a level of complexity to the larger substrate 904.

FIG. 9B illustrates an alternate technique 920 for maintaining a plurality (three of many shown) of tile substrates 922 (compare 902) in proper alignment with a larger substrate 924 (compare 904). In this case, the front (top, as viewed) surfaces of the tiles 922 are each provided with a plurality (two of many shown) of free-standing spring contacts 926 which are fabricated in a manner (e.g., materials, spring shape) such that they will operate principally in an elastic, rather than plastic mode. The back (bottom, as viewed) surfaces of the tiles 922 are each provided with a plurality (two of many shown) of contact elements 928 which are fabricated in a manner such that they will operate substantially in a plastic-deformation mode. (These contact elements 928 are termed "compliant connections".) The tiles 922 are soldered to the substrate 924 in any suitable manner, and surface tension will tend to maintain the tiles in x-y alignment with one another. In order to establish coplanarity of the tips (top ends, as viewed) of the many spring elements 926, a pressure plate 930 is urged downward against the tips of the spring elements, until contact is made with all of the spring elements 926. The plastic deformation of the spring elements 928 will allow individual tiles to move downward in the z-axis. After ensuring that the tips of all of the spring elements 926 are coplanar, the pressure plate 930 is removed, and the tiles 922 can be secured in place with a potting compound (not shown), such as epoxy. The potting compound should at least "underfill" the space between the tiles and the substrate, and may also cover the tiles (so long as only the bottoms of the free-standing spring contacts 926 are covered). This technique is generally not preferred, since it is not conducive to rework—removing and replacing an individual one of the many tile substrates 922.

As illustrated, for example, in FIGS. 9A-9B, the tile substrates 902 and 922 achieve some space-transformation (e.g., in FIG. 9A, the solder balls are spaced further apart than the bases of the free-standing spring contacts (compare FIG. 8A). It is within the scope of the invention that the spring contacts can be at the same, or at a greater spacing (pitch) than the solder balls in these and other embodiments of the invention.

FIG. 9C illustrates an alternate technique 940 for maintaining a plurality (three of many shown) of tile substrates 942 (compare 922) in proper alignment z-axis alignment with one another. For purposes of illustrative clarity, the larger substrate (e.g., 904, 924) and the connections (e.g., solder balls) on the back (bottom, as viewed) surface of the tile substrates are omitted from this figure.

In this case, the side edges of the tile substrates 942 are provided with interlocking "tongue and groove" features, such as convex features 944 that mate with concave features 946. For example, two adjacent side edges of a square or rectangular tile substrate would have concave features, the remaining two adjacent side edges would have convex features. This technique is generally not preferred, since it is involves a level of complexity in the tile substrate, and reworking would be problematic.

In all of the techniques described hereinabove, the goal of maintaining alignment of the tips of spring contacts on tiles has been addressed somewhat indirectly—namely, by controlling the alignment of the back side and/or edges of the tile substrates vis-a-vis the front surface of a larger substrate to which the plurality of tile substrates are mounted.

A more "direct" approach would be to ensure that the tips of the spring elements are properly aligned, irrespective of the alignment of the back surface of the tile substrate, the back surfaces of the tile substrates being sufficiently aligned merely to ensure proper connectivity with the larger substrate.

FIG. 9D illustrates a technique 960 wherein a plurality (three of many shown) of tiles 962 (compare 600) are aligned with one another by their front (top, as viewed) surfaces, rather than by their back surfaces. Each tile 962 has a plurality (two of many shown) of spring contacts 964 extending from its top surface, and is provided with solder balls (or pads) 966 on its back surface. It is assumed that the tile substrates 962 can carefully be inspected prior to mounting spring contacts (964) thereto, and that the spring contacts 964 can be fabricated upon the surface of the tile substrate (or on a sacrificial substrate, and gang-mounted to the tile substrates) in a highly controlled manner, or that the tiles with springs mounted thereto can readily be inspected to ensure that only "good" tiles are assembled to the larger substrate 968 (compare 622). Generally, it is a relatively straightforward and reliable (and repeatable) to fabricate a plurality of spring contacts (964) on the surface of a substrate (962), each of the spring contacts (964) extending to a prescribed height above the surface of the substrate (962), with the tips of the spring contacts being well-aligned with (spaced apart from) one another, according to the techniques set forth hereinabove (see, e.g., FIG. 2A). This technique is generally not preferred.

A stiffener substrate 970 is provided, and has a plurality of holes 972 extending therethrough. A high degree of precision in the locations of the holes can be achieved by lithographically defining their locations. The stiffener 970 may be a relatively rigid insulating material, or may be a metallic substrate covered with an insulating material.

In this case, the tile substrates 962 are mounted by their front (top, as viewed) surfaces to the back (bottom, as viewed) surface of the stiffener, with each of the spring contacts 964 extending through a corresponding one of the holes 972 in the stiffener substrate 970. This may be done with a suitable adhesive (not shown) and, during the process of mounting the tiles to the stiffener substrate, a vision system can be employed to ensure that the tips of the spring contacts are aligned with one another from tile-to-tile. In other words, this can readily be accomplished with a high degree of precision.

After all of the tile substrates (962) are aligned (x-y) and affixed to the stiffener substrate, the assembly of tiles/stiffener can be mounted in any suitable manner to the larger substrate 968, such as by solder balls 966 and corresponding pads 976 on the front (top, as viewed) surface of the larger substrate 968.

It is within the scope of the invention that the tiles 962 are affixed in a temporary manner to the stiffener substrate 970, so that the stiffener substrate 970 can be removed once the assembly of tiles 962 has been mounted to the larger substrate 968.

For re-working (replacing individual tiles from upon the larger substrate), in the case of a permanently-mounted stiffener substrate, the entire assembly of stiffener/tiles could be removed (such as by unsoldering) from the larger substrate, the individual tile(s) replaced, and the assembly re-mounted to the larger substrate. In the case of a temporary stiffener substrate, which is not part of the final assembly (of tiles to the larger substrate), individual tile(s) can be removed, and replacement tile(s) installed using a re-work stiffener substrate (not shown) which is the same size as or smaller than (covering an area of only a few adjacent tiles) the stiffener substrate (970).

As illustrated, for example, in FIGS. 9A-9D, the free-standing spring contacts are C-shaped (compare FIG. 1E). It is within the scope of the invention that the free-standing spring elements are any suitably shape, and they may be either composite interconnection elements or monolithic interconnection elements.

Membrane Tiles

It is within the scope of this invention that a plurality of tiles, having other than spring contacts (whether monolithic or composite) extending from a surface thereof, can be assembled to a larger substrate for the purpose of performing wafer-level burn-in and the like, with the aforementioned advantages accruing to same.

For example, consider a typical membrane probe, such as is disclosed in the aforementioned U.S. Pat. No. 5,180,977 ("Huff") and U.S. Pat. No. 5,422,574 ("Kister"). As noted in Huff, a membrane probe may comprise an array of microcontacts, generally known as contact bumps, on a thin dielectric film, i.e., a membrane. For each contact bump, a microstrip transmission line is formed on the membrane for electrical connection to the "performance board" (probe card). The contact bumps are formed by a metal plating method, and can be formed to create a large number of contacts with high probe density. As noted in Kister, a membrane probe typically includes an array of microcontacts (contact bumps) on a protruding part of a thin, flexible dielectric film membrane. The membrane can have a center contact bump area and a plurality of signal connection sections separated by triangular reliefs in the membrane. The system of triangular reliefs in a membrane allows the membrane to be puckered up such that the central contact bump area can be raised above the general plane of the probe card.

FIGS. 10A and 10B illustrate an alternate embodiment 1000 of the present invention. As shown therein, a tile substrate 1002 can be formed as a ring (e.g., a square ring) or frame having a central opening 1004 rather than as a solid substrate (compare, e.g., 902, 922, 942, 962). Alternatively, the central opening 1004 could simply be a recessed central area in a solid substrate, as illustrated by the tile substrate 1002a shown in FIG. 10C.

A thin dielectric film 1006 is mounted across the top (as viewed in the figures) surface of the tile frame 1002 (or substrate 1002a) and serves as a membrane. Alternatively, the thin dielectric film 1006 could be sandwiched between two halves, an upper half 1008a and a lower half 1008b of a tile frame 1002b, as illustrated by FIG. 10D.

A plurality (four of many shown) of contact bumps 1010 are formed on the top (as viewed) surface of the membrane 1006. (In a case such as is shown in FIG. 10D, it would be necessary to ensure that the contact bumps 1010 extend beyond the plane of the top ring 1008a, in any suitable manner.)

Signal lines 1012 (e.g., microstrip transmission lines) are formed on the membrane, and are routed in any suitable manner through the tile frame or substrate for electrical connection to a larger substrate (not shown) such as the "performance board" (probe card). An example is shown in FIG. 10E, wherein the tile frame 1002c comprises a top tile frame half 1018a (compare 1008a) is provided with conductive vias 1020 (1020a and 1020b) and lines 1022 terminating in solder bumps (or pads) 1024. As is illustrated by FIG. 10E, the bottommost feature of the resulting assembly (in this example, of upper tile frame half 1018a, lower tile frame half 1018b and membrane 1006) is the solder balls 1024) or the like which will be utilized to connect the individual tiles to a larger substrate (not shown) in any of the manners described hereinabove.

One having ordinary skill in the art to which the invention most nearly pertains will recognize that FIG. 10E is stylized, and that the bump contacts should be the highest (uppermost, as viewed) features, that any suitable means of making connections between a probe card and these contact bumps may be employed, and that (vis-a-vis all of FIGS. 10C-10E) an elastomer may be employed behind the membrane (e.g., 1006).

Wafer-Level Burn-In (WLBI)

As mentioned above, an advantage of tiling larger substrates with a plurality of spring contact carriers is that a sufficient number of probe elements can be provided on a probe card assembly to enable an entire semiconductor wafer to be contacted (for testing and/or burn-in) in one fell swoop (with a single pressure connection between the probe card assembly and the semiconductor wafer). As used herein, the term "wafer-level burn-in" includes any electrical function performed on an entire semiconductor wafer in this manner.

FIG. 11A illustrates an embodiment 1100 of a technique for accomplishing wafer-level burn-in. A plurality (six of many shown) of tiles 1102 having probe elements 1106 including, but not limited to, free-standing spring contacts (as illustrated), contact bumps of membrane-type tiles (e.g., 1000), or the like, are mounted to a larger substrate 3104 which may be a space transformer of a probe card assembly (compare FIG. 5). A plurality (six of many shown) of semiconductor dies 1108 are resident (unsingulated) on a semiconductor wafer 1110. In this embodiment, each tile 1102 is associated (aligned) with a given one of the semiconductor dies 1108, and the probe elements 1106 would therefore be arranged in a pattern corresponding to the bond pads of interest on the semiconductor die.

FIG. 11B illustrates another embodiment 1120 of a technique for accomplishing wafer-level burn-in. A plurality (three of many shown) of tiles 1122a, 1122b and 1122c having probe elements 1126 (again, including, but not limited to, free-standing spring contacts, contact bumps of membrane-type tiles or the like), are mounted to a larger substrate 1124 (again, which may be a space transformer of a probe card assembly). A plurality (six of many shown) of semiconductor dies 1128a-1128f are resident (unsingulated) on a semiconductor wafer 1130.

In this embodiment, each tile 1122a-1122c is associated (aligned) with two adjacent semiconductor dies 1128a-1128f. The tile 1122a is provided with two sets of probe elements 1126, each set arranged in a pattern corresponding to the bond pads of interest on a one of the two corresponding semiconductor dies 1128a and 1128b. The tile 1122b is provided with two sets of probe elements 1126, each set arranged in a pattern corresponding to the bond pads of interest on a one of the two corresponding semiconductor dies 1128c and 1128d. The tile 1122c is provided with two sets of probe elements 1126, each set arranged in a pattern corresponding to the bond pads of interest on a one of the two corresponding semiconductor dies 1128e and 1128f.

FIG. 11C illustrates another embodiment 1140 of a technique for accomplishing wafer-level burn-in. A plurality (six of many shown) of tiles 1142a-1142f having probe elements 1106 (again, including, but not limited to, free-standing spring contacts, contact bumps of membrane-type tiles, or the like), are mounted to a larger substrate 1144 (again, which may be a space transformer of a probe card assembly). A plurality (five of many shown) of semiconductor dies 1148a-1148e are resident (unsingulated) on a semiconductor wafer 1150. Note that in this figure, the edges of the semiconductor wafer 1150 are shown, and that a full semiconductor die cannot be fabricated to the left (as viewed) of the semiconductor die 1148a, nor can a full semiconductor die be fabricated to the right (as viewed) of the semiconductor die 1148e.

In this embodiment 1140, it is illustrated that although there is (generally) a tile for each semiconductor die, the probe elements on each tile are arranged to contact only a portion of the bond pads on a one semiconductor die and a portion of the bond pads on an other, adjacent semiconductor die. For example, the probe elements on the tile 1142b contact the right (as viewed) portion of the semiconductor die 1148a and the left (as viewed) portion of the semiconductor die 1148b.

The tile 1142a extends over an unusable die site at the edge of the semiconductor wafer, and need only contact the left (as viewed) portion of the semiconductor die 1148a. Therefore, the tile 1142a does not need to be provided with a full set of probe elements, and is dissimilar from the majority (1142b-1142e) of the tiles. A similar result accrues to the tile 1142f. It is, however, within the scope of this invention that the tiled 1142a and 1142f can be identical to the tiles 1142b-1142e.

In the preceding examples (embodiments) of techniques for performing wafer-level burn-in, it is reasonably assumed that all of the semiconductor dies on the semiconductor wafer will is be identical in design and layout to one another. Hence, tiles will generally be identical to one another (excepting the peripheral tiles 1142a and 1142f). It is, however, within the scope of this invention that a plurality of dissimilar tiles, with dissimilar layouts of probe elements can be mounted to a larger substrate for wafer-level burn-in or for any other application wherein a plurality of pressure connections are required.

Thermal Coefficient of Expansion Considerations

As set forth above, a probe card element, such as a space transformer component (e.g., 622) can be populated with a plurality of tiles (e.g., 600) on a surface thereof, the tiles each carrying a plurality of spring contact elements (e.g., 612, 614) which are readily yielded at tile-level, then flip-chip connected to a surface of the larger substrate (e.g., the probe card element), to facilitate, for example, wafer-level burn-in.

In such an endeavor, it is often necessary to take into consideration the thermal coefficients of expansion of the various components involved, including the component being probed (e.g., match the thermal coefficient of expansion of the probe card to that of a semiconductor wafer). Generally, as is known, the thermal coefficients of expansion of various materials closely (sufficiently) match that of silicon, including copper-invar-copper laminate, aluminum nitride ceramic (an insulating material), and glass ceramic (an insulating material). The thermal coefficient of expansion of molybdenum approximates that of ceramic.

FIG. 12A is a cross-sectional view of a technique 1200 for mounting a plurality (one of many shown) of tiles 1202 (compare 602) to a larger substrate 1204 (compare 622) which is suitably the space transformer component of the aforementioned probe card assembly, in a manner which will alter the overall thermal coefficient of expansion of this assembly to adequately match that of a semiconductor wafer (not shown) being probed, such as for wafer-level burn-in, and making exemplary requisite connections to the larger substrate 1204 with another interconnection component 1206 such as the interposer component (e.g., 504) of the probe card assembly of the invention.

A plurality (six of many shown) of spring elements 1210 are mounted to the top (as viewed) surface of the tile substrate 1202, in any suitable manner described hereinabove, such as to terminals disposed thereupon. In this example, the tile substrates 1202 do not perform any space transformation. The tile substrates 1202 are flip-chip mounted to the top (as viewed) surface of the larger substrate 1204 which has terminals on its top surface at a one pitch (spacing) and terminals on its bottom (as viewed) surface at an other larger (coarser) pitch. The larger substrate 1204 is suitably a multilayer wiring substrate such as the aforementioned space transformer component of the aforementioned probe card assembly.

A "passive" substrate 1220 is mounted with a suitable adhesive 1222 to the bottom (as viewed) surface of the larger substrate 1204, and is provided with a plurality (two of many shown) of openings 1226 aligned with the terminals on the bottom (as viewed) surface of the larger (space transformer) substrate 604. The purpose of the passive substrate 1220 is to control (e.g., alter) the thermal coefficient of expansion of the assembly of the tiles (1202) and the space transformer (1204), preferably to match that of a component being probed by the tips (top ends, as viewed) of the spring elements 1210.

In this example, the passive substrate 1220 is a readily-available copper/invar/copper laminate, which is electrically conductive. In order to avoid shorting out the terminals on the bottom surface of the space transformer substrate (for that matter, to also avoid shorting out the spring elements 1230 described hereinbelow), the substrate 1220 is coated with a suitable insulating material 1224, such as parylene.

Connections to the bottom (as viewed) terminals of the space transformer (larger) substrate 1204 may be effected with tips (top ends, as viewed) of spring elements 1230 which are suitably composite interconnection elements (as shown) of the present invention held in a defined spatial relationship with one another by a support substrate 1232 which has openings though which the spring elements 1230 extend and are retained by a suitable elastomeric compound 1234.

FIG. 12B is a cross-sectional view of an alternate technique 1250 for mounting a plurality (one of many shown) of tiles 1202 to a larger substrate 1204, in the aforementioned manner, with the following variation.

In this embodiment 1250, the top (as viewed) ends of the interconnection elements 1230 do not directly contact the terminals on the bottom (as viewed) surface of the larger substrate 1204. Rather, the holes (openings) 1226 in the substrate 1220 are filled with an interconnect material 1252, such as z-axis conductive adhesive or conductive (e.g., silver-filled) epoxy. This relaxes constraints on the shape and height of the interconnection elements 1230, which need not extend through the holes 1226.

This permits the thermal coefficient of expansion (TCE) of an assembly of tiles populating a larger substrate to be matched (substantially) to the TCE of another electronic component being contacted by the spring contacts on the tiles.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, in any of the embodiments described or suggested herein where a masking material (e.g., photoresist) is applied to a substrate and patterned such as by exposure to light passing through a mask and chemically removing portions of the masking material (i.e., conventional photolithographic techniques), alternate techniques can be employed, including directing a suitable collimated light beam (e.g., from an excimer laser) at portions of the masking material (e.g., blanket hardened photoresist) sought to be removed, thereby ablating these portions of the masking material, or directly (without the use of a mask) hardening portions of the masking material with a suitable collimated light beam then chemically washing off the non-hardened masking material.

It has been suggested hereinabove that the composite interconnection elements of the present invention are but an example of suitable resilient contact structures that can be mounted directly to terminals of a tile component of a probe card assembly. For example, it is within the scope of this invention that needles of an inherently resilient (relatively high yield strength) material, such as tungsten, can be coated with a material, such as solder or gold, to make them solderable, optionally supported in a desired pattern, and soldered to the terminals of the tile.

For example, a tile substrate having conductive vias extending therethrough from terminals on one surface to terminals on an opposite surface thereof can have spring elements mounted to the terminals on the one surface, a semiconductor die mounted directly (such as by C4 solder joints) to the terminals on the opposite side, and encapsulated to serve as a semiconductor chip assembly.

It is also within the scope of this invention that the tile substrates are of a translucent (or transparent) material, to provide the ability to determine the "offset" of the tips of the spring contacts on the one surface of tile substrate from the terminals on the other opposite surface of the tile substrate. Else, to make such a determination, an instrumentality such as a two-camera vision system or x-rays, or the like, would need to be employed.

For example, the larger substrate which is populated by the tiles can have electronic components in (buried) or on it, such as resistors and capacitors, current limiting devices (typically resistor networks), active switching components (e.g., for routing signals to selected terminals), and the like.

For example, standoff elements (compare 856) can be incorporated onto the back (reverse) side of the tile substrate (or, alternatively, on the front (obverse) side of the larger substrate) in order to prevent "reflow crushing" (a phenomenon which may occur when tiles which are soldered to a larger substrate are urged (such as for wafer probing) against an electronic component (e.g., semiconductor wafer) and the temperature is elevated—resulting in softening of the solder joints joining the tiles to the larger substrate).

For example, the tips of a plurality of spring contacts extending from a plurality of tiles mounted to a larger substrate can be aligned by urging the tips into an alignment substrate (compare 930, FIG. 9B) which has micromachined depressions at the desired locations (spacing, alignment) of the tips.

What is claimed is:

1. An assembly for contacting a semiconductor wafer, the assembly comprising:
    a plurality of tile subassemblies, each tile subassembly comprising:
        a tile substrate having two opposite surfaces;
        a plurality of resilient contacts extending from a first of the two opposite surfaces;
        a plurality of first terminals on a second of the two opposite surfaces and each one of the plurality of first terminals connected to a corresponding one of the plurality of contacts; and
    a second substrate having a plurality of second terminals on a surface thereof, the tile assemblies fixed to the second substrate with the plurality of first terminals connected to the plurality of second terminals.

2. The assembly of claim 1, wherein the second substrate comprises an insulating material.

3. The assembly of claim 1, wherein the second substrate is a space transformer comprised of a ceramic material.

4. The assembly of claim 1 further comprising:
    a plurality of third terminals adjacent the second substrate, selected ones of the plurality of third terminals connected with corresponding ones of the plurality of second terminals.

5. The assembly of claim 4 further comprising a first spacing between first and second closest-spaced ones of the plurality of third terminals and a second spacing between the corresponding ones of the plurality of second terminals.

6. The assembly of claim 5 wherein the first spacing is closer than the second spacing.

7. The assembly of claim 1, wherein the first surface of a first of the plurality of tile subassemblies and the first surface of a second of the plurality of tile subassemblies are substantially coplanar.

8. The assembly of claim 1, wherein a plurality of contacts comprise composite interconnection elements, each interconnection element having a base portion attached to the first surface of the tile and connected to a respective one of the first terminals, and a resilient, elongate, free standing section extending from the base portion.

9. The assembly of claim 8 wherein each interconnection element further comprises:
    a core of soft material having a relatively low yield strength; and
    a shell of hard material having a yield strength higher than the soft material, deposited on the core to a thickness sufficient to impart a desired resiliency to the interconnection element.

10. The assembly of claim 8, wherein each interconnection element further comprises a tip structure mounted on a free end thereof.

11. The assembly of claim 1, wherein the second substrate comprises a space transformer component of a probe assembly.

12. The assembly of claim 1, further comprising z-axis alignment means for maintaining tips of said plurality of contacts on each of said plurality of tile assemblies at a prescribed height relative to the surface of the second substrate.

13. The assembly of claim 12, wherein the z-axis alignment means comprises a plurality of compliant connections disposed between and connecting the selected ones of the plurality of first terminals and the selected ones of the plurality of second terminals.

14. The assembly of claim 12, wherein the z-axis alignment means comprises a plurality of substantially equal volumes of solder disposed between and connecting the selected ones of the plurality of first terminals and the selected ones of the plurality of second terminals.

15. The assembly of claim 1, further comprising
    x-y alignment means for maintaining a prescribed spacing between individual ones of the plurality of tile subassemblies.

16. The assembly of claim 1, further comprising a passive substrate adhered to a bottom surface of the second substrate, wherein the bottom surface is opposite to the surface mounted to the plurality of tile subassemblies.

17. The assembly of claim 16, wherein the passive substrate comprises a copper/invar/copper laminate.

18. The assembly of claim 1, wherein an average pitch between adjacent ones of the plurality of tiles is substantially the same as an average pitch between adjacent semiconductor devices on the semiconductor wafer.

* * * * *